US012136643B2

(12) United States Patent
Lim et al.

(10) Patent No.: US 12,136,643 B2
(45) Date of Patent: Nov. 5, 2024

(54) IMAGE SENSOR

(71) Applicant: Samsung Electronics Co., Ltd., Suwon-si (KR)

(72) Inventors: Kangmook Lim, Sejong-si (KR); Seungsik Kim, Hwaseong-si (KR); Yeoseon Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 450 days.

(21) Appl. No.: 17/720,010

(22) Filed: Apr. 13, 2022

(65) Prior Publication Data

US 2022/0336514 A1    Oct. 20, 2022

(30) Foreign Application Priority Data

Apr. 19, 2021 (KR) .................. 10-2021-0050627

(51) Int. Cl.
*H01L 27/146* (2006.01)
(52) U.S. Cl.
CPC .... *H01L 27/14636* (2013.01); *H01L 27/1462* (2013.01); *H01L 27/14621* (2013.01); *H01L 27/14627* (2013.01); *H01L 27/1463* (2013.01); *H01L 27/14634* (2013.01); *H01L 27/14645* (2013.01)
(58) Field of Classification Search
CPC ........... H01L 27/14636; H01L 27/1462; H01L 27/14621; H01L 27/14627; H01L 27/1463; H01L 27/14634; H01L 27/14645; H01L 27/14689; H01L 27/14603; H01L 27/14638; H01L 27/14612; H01L 27/1464; H01L 27/14654–14656; H04N 25/70
See application file for complete search history.

(56) References Cited

U.S. PATENT DOCUMENTS

| | | | | |
|---|---|---|---|---|
| 6,850,278 | B1* | 2/2005 | Sakurai | H04N 25/59 348/E3.018 |
| 7,319,242 | B2* | 1/2008 | Shimizu | G02B 3/0056 257/98 |
| 7,446,294 | B2* | 11/2008 | Lin | H01L 27/14685 250/214 R |
| 7,821,559 | B2* | 10/2010 | Kishi | H04N 25/76 348/308 |
| 9,209,211 | B2 | 12/2015 | Manouvrier et al. | |
| 9,324,746 | B2 | 4/2016 | Choi et al. | |

(Continued)

*Primary Examiner* — Jarrett J Stark
(74) *Attorney, Agent, or Firm* — Muir Patent Law, PLLC

(57) ABSTRACT

An image sensor may include a first substrate having first and second surfaces and including unit pixel regions, each of which includes a device isolation pattern and a photoelectric conversion region adjacent to the first surface of the first substrate, a pixel isolation pattern provided in the first substrate to define the unit pixel regions and to penetrate the device isolation pattern, a first impurity region and a floating diffusion region provided in the first substrate and adjacent to the first surface, a second substrate provided on the first substrate to have third and fourth surfaces, a second impurity region provided in the second substrate and adjacent to the third surface, and ground and body contacts coupled to the first and second impurity regions, respectively. The ground contact and the body contact may be electrically separated from each other.

20 Claims, 26 Drawing Sheets

(56) References Cited

U.S. PATENT DOCUMENTS

| | | | |
|---|---|---|---|
| 9,372,286 B2* | 6/2016 | Li | B29D 11/00384 |
| 9,391,112 B2* | 7/2016 | Shimotsusa | H01L 27/14636 |
| 9,508,771 B2* | 11/2016 | Lee | H01L 27/1464 |
| 9,780,142 B1* | 10/2017 | Koo | H01L 27/14614 |
| 9,887,219 B2* | 2/2018 | Sano | H04N 25/76 |
| 10,134,792 B2 | 11/2018 | Lee et al. | |
| 10,153,312 B2 | 12/2018 | Roy et al. | |
| 10,411,054 B2 | 9/2019 | Kwag et al. | |
| 10,586,824 B2* | 3/2020 | Kim | H01L 27/1464 |
| 10,728,475 B2* | 7/2020 | Yanagita | H04N 25/78 |
| 10,741,599 B2* | 8/2020 | Yanagita | H01L 27/14623 |
| 10,840,280 B2* | 11/2020 | Tomekawa | H01L 27/14607 |
| 11,563,050 B2* | 1/2023 | Asatsuma | H01L 27/14612 |
| 11,800,729 B2* | 10/2023 | Moriwaki | H10K 30/30 |
| 11,888,006 B2* | 1/2024 | Miyanami | H01L 27/14605 |
| 12,074,187 B2* | 8/2024 | Ha | H01L 27/14621 |
| 2004/0096124 A1* | 5/2004 | Nakamura | H04N 25/778 |
| | | | 348/E3.019 |
| 2005/0078377 A1* | 4/2005 | Li | B29D 11/00365 |
| | | | 359/619 |
| 2005/0110093 A1* | 5/2005 | Altice | H04N 25/77 |
| | | | 348/E3.018 |
| 2008/0211945 A1* | 9/2008 | Hong | H04N 25/134 |
| | | | 348/294 |
| 2008/0266434 A1* | 10/2008 | Sugawa | H04N 25/621 |
| | | | 348/308 |
| 2008/0290382 A1* | 11/2008 | Hirota | H01L 27/14627 |
| | | | 348/294 |
| 2011/0076001 A1* | 3/2011 | Iwasaki | H04N 25/134 |
| | | | 396/114 |
| 2011/0121162 A1* | 5/2011 | Murata | H01L 27/14645 |
| | | | 250/214 P |
| 2011/0175981 A1* | 7/2011 | Lai | H04N 13/254 |
| | | | 348/46 |
| 2011/0215223 A1* | 9/2011 | Unagami | H04N 25/585 |
| | | | 257/E27.159 |
| 2011/0228149 A1* | 9/2011 | Naruse | H04N 25/585 |
| | | | 348/E5.091 |
| 2012/0086845 A1* | 4/2012 | Enomoto | H01L 27/14689 |
| | | | 438/57 |
| 2012/0217601 A1* | 8/2012 | Miyanami | H01L 27/14621 |
| | | | 257/E31.127 |
| 2012/0262616 A1* | 10/2012 | Sa | H04N 25/77 |
| | | | 348/311 |
| 2014/0252527 A1* | 9/2014 | Sato | H01L 27/14634 |
| | | | 257/433 |
| 2014/0253767 A1* | 9/2014 | Kato | H04N 25/134 |
| | | | 257/432 |
| 2015/0084144 A1* | 3/2015 | Suzuki | H01L 27/14607 |
| | | | 438/70 |
| 2016/0276396 A1* | 9/2016 | Tayanaka | H01L 27/14607 |
| 2016/0358967 A1* | 12/2016 | Madurawe | H01L 27/1464 |
| 2017/0099422 A1* | 4/2017 | Goma | H04N 25/70 |
| 2018/0115727 A1* | 4/2018 | Yanagita | H01L 27/14645 |
| 2018/0152650 A1* | 5/2018 | Sakakibara | H04N 25/771 |
| 2018/0184025 A1* | 6/2018 | Yanagita | H04N 25/78 |
| 2018/0190692 A1* | 7/2018 | Choi | H01L 27/14621 |
| 2018/0191973 A1* | 7/2018 | Hirota | H04N 25/76 |
| 2018/0241955 A1* | 8/2018 | Sakano | H04N 25/585 |
| 2018/0294300 A1 | 10/2018 | Ishida et al. | |
| 2018/0308883 A1* | 10/2018 | Yanagita | H01L 27/14621 |
| 2018/0366513 A1* | 12/2018 | Yang | H04N 25/78 |
| 2019/0019820 A1* | 1/2019 | Takizawa | H01L 27/14645 |
| 2019/0043900 A1* | 2/2019 | Oka | H04N 25/59 |
| 2019/0096933 A1* | 3/2019 | Kido | H01L 27/14641 |
| 2019/0098232 A1* | 3/2019 | Mori | H01L 27/1464 |
| 2019/0222811 A1* | 7/2019 | Yamaguchi | H01L 27/14638 |
| 2019/0341411 A1* | 11/2019 | Lim | H01L 27/14614 |
| 2020/0154066 A1* | 5/2020 | Johnson | H04N 25/59 |
| 2020/0404204 A1* | 12/2020 | Kawazu | H04N 25/702 |
| 2021/0143191 A1* | 5/2021 | Ha | H01L 27/1463 |
| 2022/0336514 A1* | 10/2022 | Lim | H01L 27/14634 |
| 2022/0367536 A1* | 11/2022 | Saka | H01L 27/14643 |

* cited by examiner

IMAGE SENSOR

CROSS-REFERENCE TO RELATED APPLICATIONS

This U.S. non-provisional patent application claims priority under 35 U.S.C. § 119 to Korean Patent Application No. 10-2021-0050627, filed on Apr. 19, 2021, in the Korean Intellectual Property Office, the entire contents of which are hereby incorporated by reference.

BACKGROUND OF THE INVENTION

The present disclosure relates to an image sensor, and in particular, to a complementary metal oxide semiconductor (CMOS) image sensor.

An image sensor is a device converting an optical image to electrical signals. The image sensor is classified into two types: a charge coupled device (CCD) type and a complementary metal-oxide-semiconductor (CMOS) type. The CMOS-type image sensor is called CIS for short. The CIS includes a plurality of unit pixel regions which are two-dimensionally arranged. Each of the unit pixel regions includes a photodiode, which is used to convert an incident light to an electric signal.

SUMMARY

An embodiment of the inventive concept provides an image sensor, which has an increased operation voltage range and is operated with an increased degree of freedom.

According to an embodiment of the inventive concept, an image sensor may include a first substrate having a first surface and a second surface, which are opposite to each other, the first substrate including unit pixel regions, each of which includes a device isolation pattern and a photoelectric conversion region that are provided adjacent to the first surface of the first substrate, a pixel isolation pattern provided in the first substrate to define the unit pixel regions, the pixel isolation pattern penetrating the device isolation pattern, a first impurity region and a floating diffusion region, which are provided in the first substrate and adjacent to the first surface, each of the first impurity region and the floating diffusion region being adjacent to a portion of the device isolation pattern, a second substrate provided on the first substrate, the second substrate having a third surface and a fourth surface, which are opposite to each other, a second impurity region provided in the second substrate and adjacent to the third surface, a ground contact coupled to the first impurity region, and a body contact coupled to the second impurity region. The ground contact and the body contact may be electrically separated from each other.

According to an embodiment of the inventive concept, an image sensor may include a first substrate having a first surface and a second surface, which are opposite to each other, and including a plurality of unit pixel regions, each of the plurality of unit pixel regions including a device isolation pattern and a floating diffusion region, which are provided adjacent to the first surface, and a photoelectric conversion region, which is provided below the floating diffusion region, a second substrate on the first substrate, the second substrate including a third surface and a fourth surface, which are opposite to each other, an insulating layer provided between the first substrate and the second substrate, a pixel isolation pattern provided to penetrate the first substrate and the device isolation pattern and to define the plurality of unit pixel regions, a first impurity region provided in the first substrate and adjacent to a portion of the device isolation pattern, a second impurity region adjacent to the third surface of the second substrate, a ground contact coupled to the first impurity region, and a body contact coupled to the second impurity region. A voltage applied to the first substrate through the ground contact may be different from a voltage applied to the second substrate through the body contact.

According to an embodiment of the inventive concept, an image sensor may include a first substrate having a first surface and a second surface, which are opposite to each other, and including an optical black region, a pad region, and a pixel array region including a plurality of unit pixel regions, a pixel isolation pattern provided in the first substrate to define the plurality of unit pixel regions, the pixel isolation pattern including a first isolation pattern and a second isolation pattern interposed between the first isolation pattern and the first substrate, a photoelectric conversion region provided in each of the plurality of unit pixel regions, a device isolation pattern, a first impurity region, and a floating diffusion region, which are provided in each of the plurality of unit pixel regions and are adjacent to the first surface, each of the first impurity region and the floating diffusion region being adjacent to a portion of the device isolation pattern, a first gate electrode on the first surface of the first substrate, a gate dielectric pattern interposed between the first gate electrode and the first substrate, a gate spacer provided on a side surface of the first gate electrode, a second substrate provided on the first substrate, the second substrate having a third surface and a fourth surface, which are opposite to each other, a second impurity region provided adjacent to the third surface of the second substrate, an interlayer insulating layer provided between the first substrate and the second substrate, a ground contact provided in the interlayer insulating layer and coupled to the first impurity region, a body contact provided in the interlayer insulating layer and coupled to the second impurity region, an anti-reflection layer provided on the second surface of the first substrate, a rear insulating layer on a bottom surface of the anti-reflection layer, a color filter on a bottom surface of the rear insulating layer, and a micro lens on a bottom surface of the color filter. The ground contact and the body contact may be electrically separated from each other.

BRIEF DESCRIPTION OF THE DRAWINGS

Embodiments of the inventive concept will be more clearly understood from the following detailed description taken in conjunction with the accompanying drawings in which like numerals refer to like elements throughout. In the drawings.

DETAILED DESCRIPTION

Figure 1:
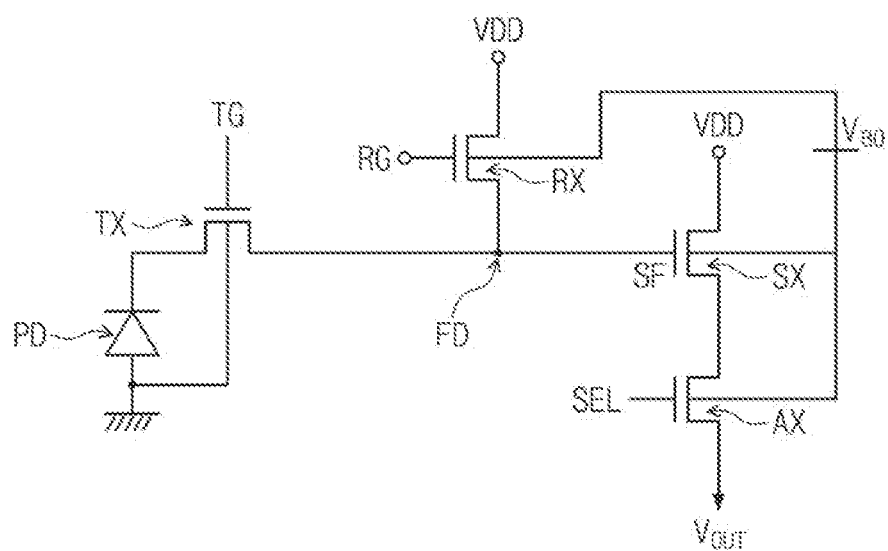
FIG. 1 is a circuit diagram illustrating an image sensor, according to an example embodiment of the inventive concept.

FIG. 1 is a circuit diagram illustrating an image sensor according to an embodiment of the inventive concept.

Referring to FIG. 1, each of unit pixel regions of an image sensor may include a photoelectric conversion region PD, a transfer transistor TX, a source follower transistor SX, a reset transistor RX, and a selection transistor AX. The transfer transistor TX, the source follower transistor SX, the reset transistor RX, and the selection transistor AX may include a transfer gate TG, a source follower gate SF, a reset gate RG, and a selection gate SEL, respectively.

The photoelectric conversion region PD may be a photodiode including an n-type impurity region and a p-type impurity region. A floating diffusion region FD may be used as a drain electrode of the transfer transistor TX. The floating diffusion region FD may be used as a source electrode of the reset transistor RX. The floating diffusion region FD may be electrically connected to the reset gate RG. The source follower transistor SX may be connected to the selection transistor AX.

Hereinafter, an operation of the image sensor will be described with reference to FIG. 1. In a light-blocking state, a power voltage VDD may be applied to drain electrodes of the reset and source follower transistors RX and SX to turn on the reset transistor RX and to discharge remnant electric charges from the floating diffusion region FD. Next, the reset transistor RX may be turned off, and in this case, if an external light is incident into the photoelectric conversion region PD, electron-hole pairs may be produced in the photoelectric conversion region PD. The holes may be moved to and accumulated in the p-type impurity region of the photoelectric conversion region PD, and the electrons may be moved to and accumulated in the n-type impurity region of the photoelectric conversion region PD. In this state, if the transfer transistor TX is turned on, the electric charges, such as electrons and holes, may be transferred to and accumulated in the floating diffusion region FD. A change in amount of the accumulated electric charges may lead to a change in source potential of the source follower transistor SX. In this case, if the selection transistor AX is turned on, an amount of the electric charges may be read out as an electric signal to be transmitted through a column line.

An interconnection line may be electrically connected to at least one of the transfer gate TG, the source follower gate SF, the reset gate RG, and the selection gate SEL. The interconnection line may be configured to apply the power voltage VDD to the drain electrode of the reset transistor RX or the drain electrode of the source follower transistor SX. The interconnection line may include a column line connected to the selection transistor AX. The interconnection line may be one of several interconnection lines, which will be described below.

A ground voltage (GND) may be applied to the photoelectric conversion region PD and a substrate portion of the transfer transistor TX. A body voltage $V_{BO}$ may be applied to a substrate portion of each of the reset transistor RX, the source follower transistor SX, and the selection transistor AX. In an embodiment, the body voltage $V_{BO}$ may be a negative voltage.

FIG. 1 illustrates an example in which the photoelectric conversion region PD is connected to one floating diffusion region FD, but the inventive concept is not limited to this example. For example, one unit pixel region may be configured to include the photoelectric conversion region PD, the floating diffusion region FD, and four transistors TX, RX, AX, and SX, and here, the reset, source follower, or selection transistor RX, SX, or AX may be shared by neighboring unit pixel regions. In this case, an integration density of the image sensor may be increased.

Figure 2:
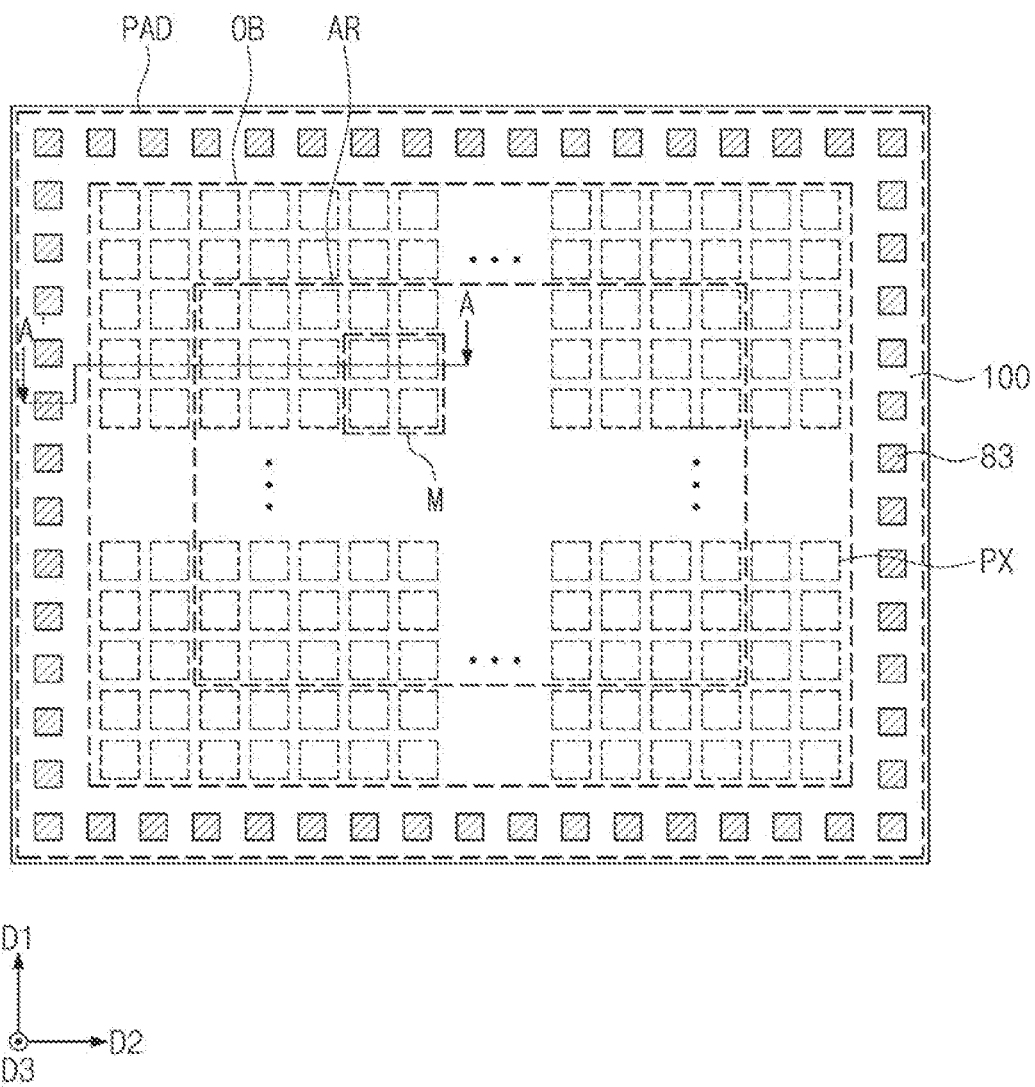
FIG. 2 is a plan view illustrating an image sensor, according to an example embodiment of the inventive concept.
Figure 3:
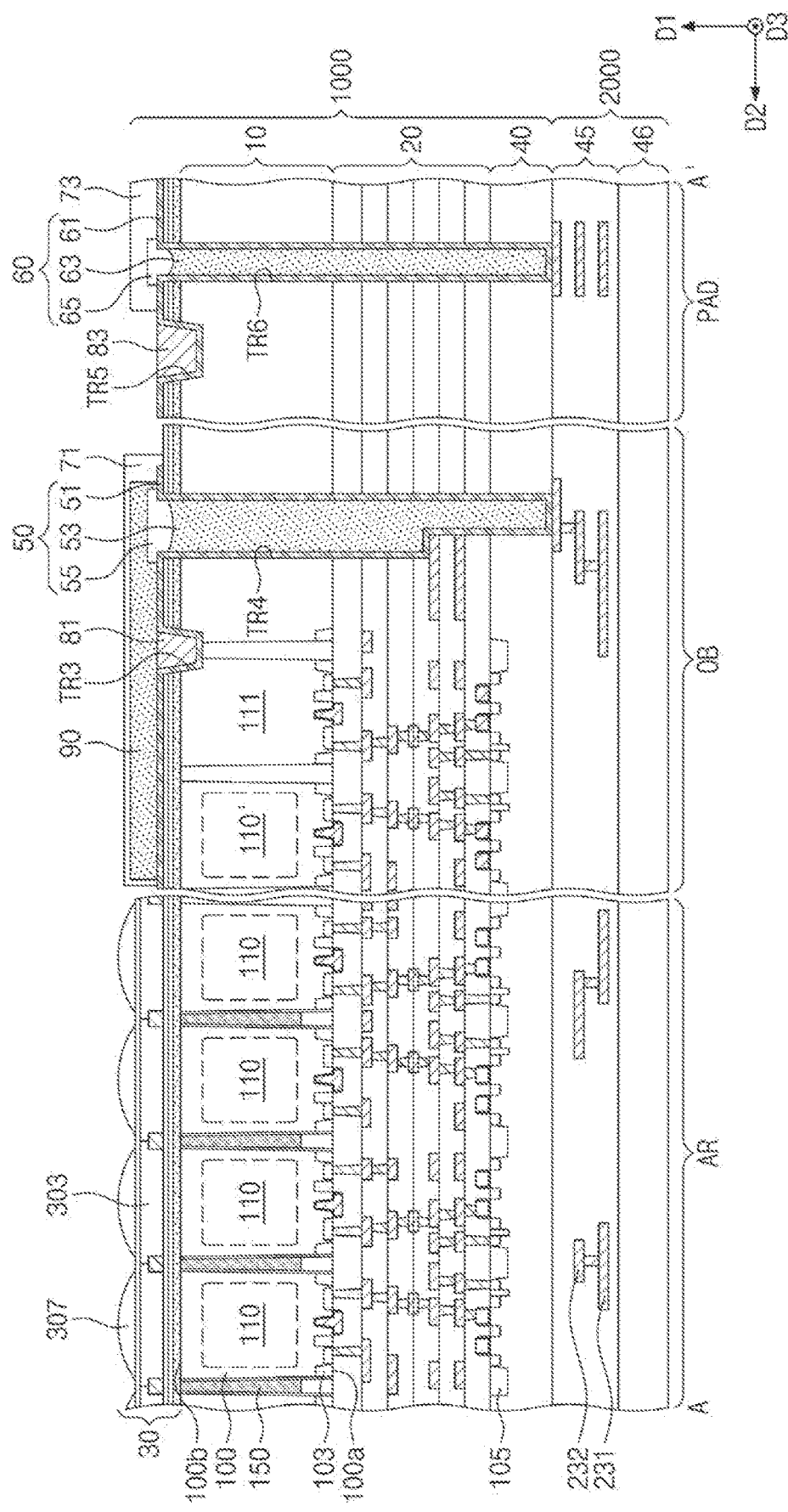
FIG. 3 is a sectional view taken along a line A-A' of FIG. 2.

FIG. 2 is a plan view illustrating an image sensor, according to an example embodiment of the inventive concept. FIG. 3 is a sectional view taken along a line A-A' of FIG. 2.

Referring to FIGS. 2 and 3, an image sensor may include a sensor chip 1000 and a logic chip 2000. The sensor chip 1000 may include a photoelectric conversion layer 10, a first interconnection layer 20, and an optically-transparent layer 30. The photoelectric conversion layer 10 may include a first substrate 100, a pixel isolation pattern 150, a first device isolation pattern 103, and photoelectric conversion regions 110 provided in the first substrate 100. The photoelectric conversion regions 110 may convert light, which is incident from the outside, to electrical signals.

The first substrate 100 may include a pixel array region AR, an optical black region OB, and a pad region PAD, when viewed in a plan view. The pixel array region AR may be disposed in a center region of the first substrate 100, when viewed in a plan view. The pixel array region AR may include a plurality of unit pixel regions PX. The unit pixel regions PX may be configured to generate photoelectric signals from the incident light and to output the photoelectric signals. The unit pixel regions PX may be two-dimensionally arranged to form a plurality of columns and a plurality of rows. The columns may be parallel to a first direction D1. The rows may be parallel to a second direction D2. In the present specification, the first direction D1 may be parallel to a first surface 100a of the first substrate 100. The second direction D2 may be parallel to the first surface 100a of the first substrate 100 and may be different from the first direction D1. For example, the second direction D2 may be substantially perpendicular to the first direction D1. A third direction D3 may be substantially perpendicular to the first surface 100a of the first substrate 100. The third direction D3 may be referred to as a vertical direction.

The pad region PAD may be provided in an edge region of the first substrate 100 to enclose the pixel array region AR, when viewed in a plan view. Second pad terminals 83 may be provided on the pad region PAD. The second pad terminals 83 may be used to output electrical signals, which are produced in the unit pixel regions PX, to the outside. In addition, an external signal or voltage may be provided to the unit pixel regions PX through the second pad terminals 83. Since the pad region PAD is disposed in the edge portion of the first substrate 100, the second pad terminals 83 may be easily coupled to the outside.

The optical black region OB may be disposed between the pixel array region AR and the pad region PAD of the first substrate 100. The optical black region OB may be provided to enclose the pixel array region AR, when viewed in a plan view. The optical black region OB may include a plurality of dummy regions 111. A signal produced in the dummy region 111 may be used as information for removing a process noise. Hereinafter, the pixel array region AR of the image sensor will be described in more detail with reference to FIGS. 4 to 16.

Figure 4:
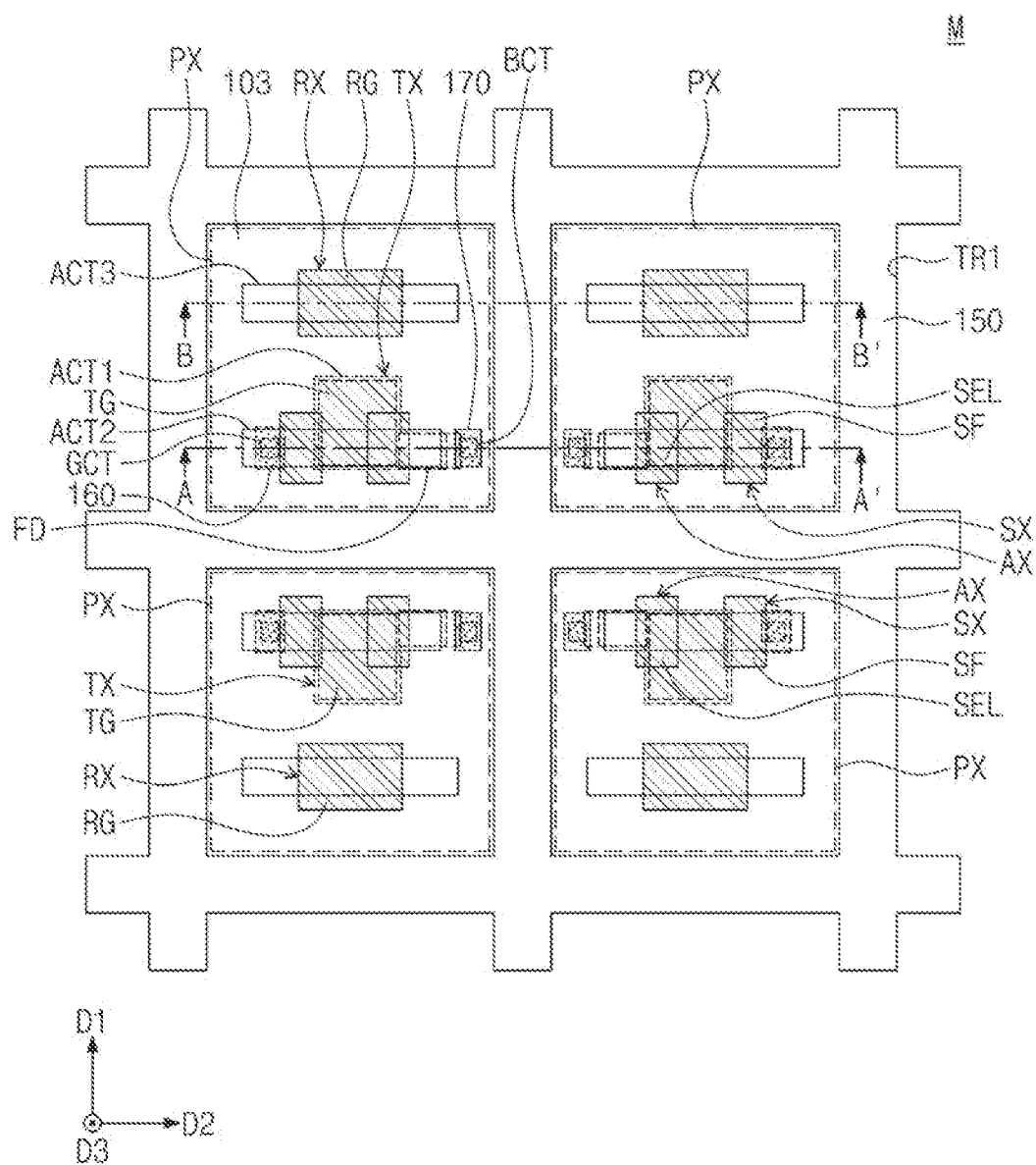
FIG. 4 is an enlarged plan view illustrating a portion 'M' of FIG. 2.
Figure 5:
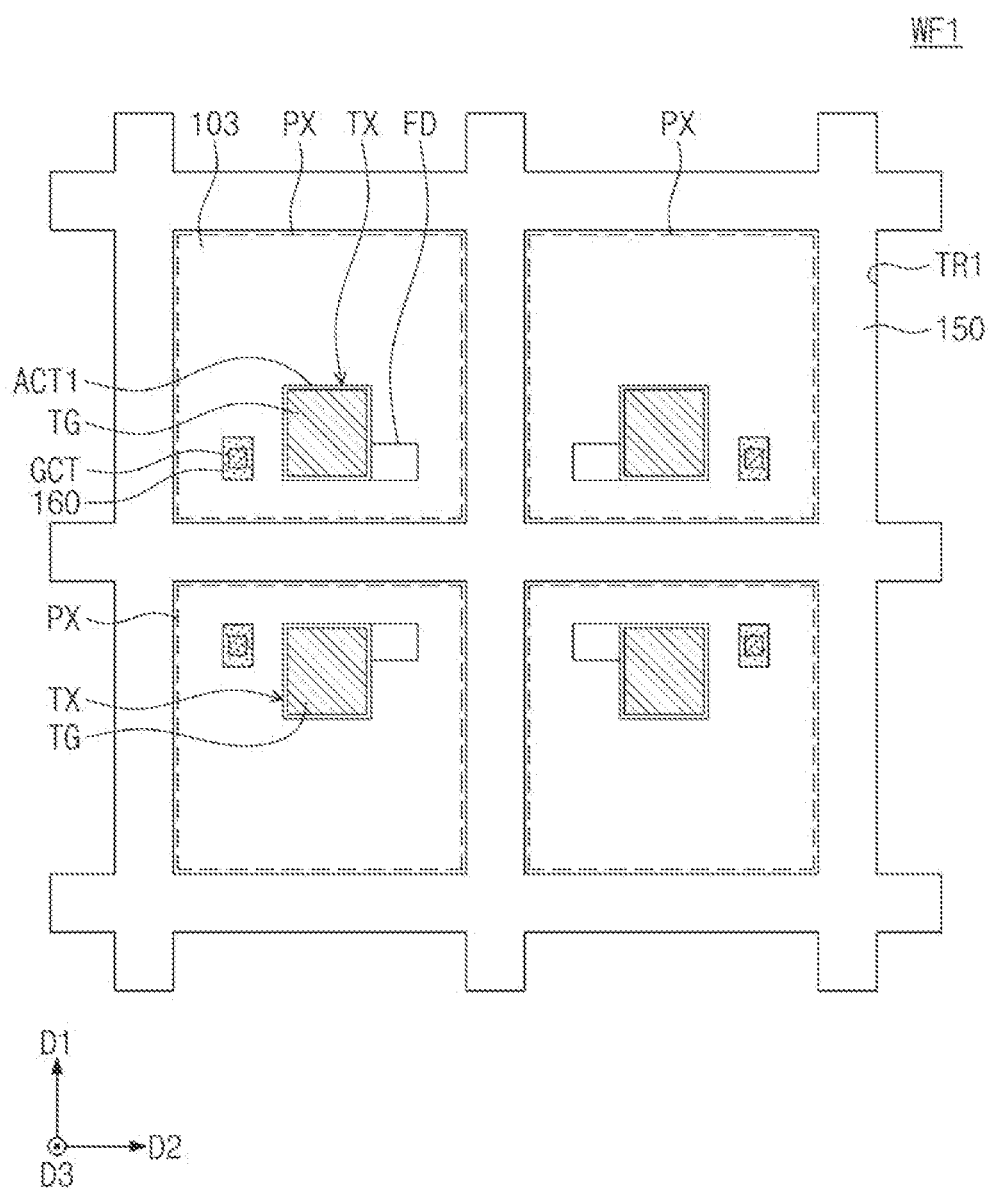
FIG. 5 is a plan view of a first wafer portion of the image sensor of FIG. 4.
Figure 6:
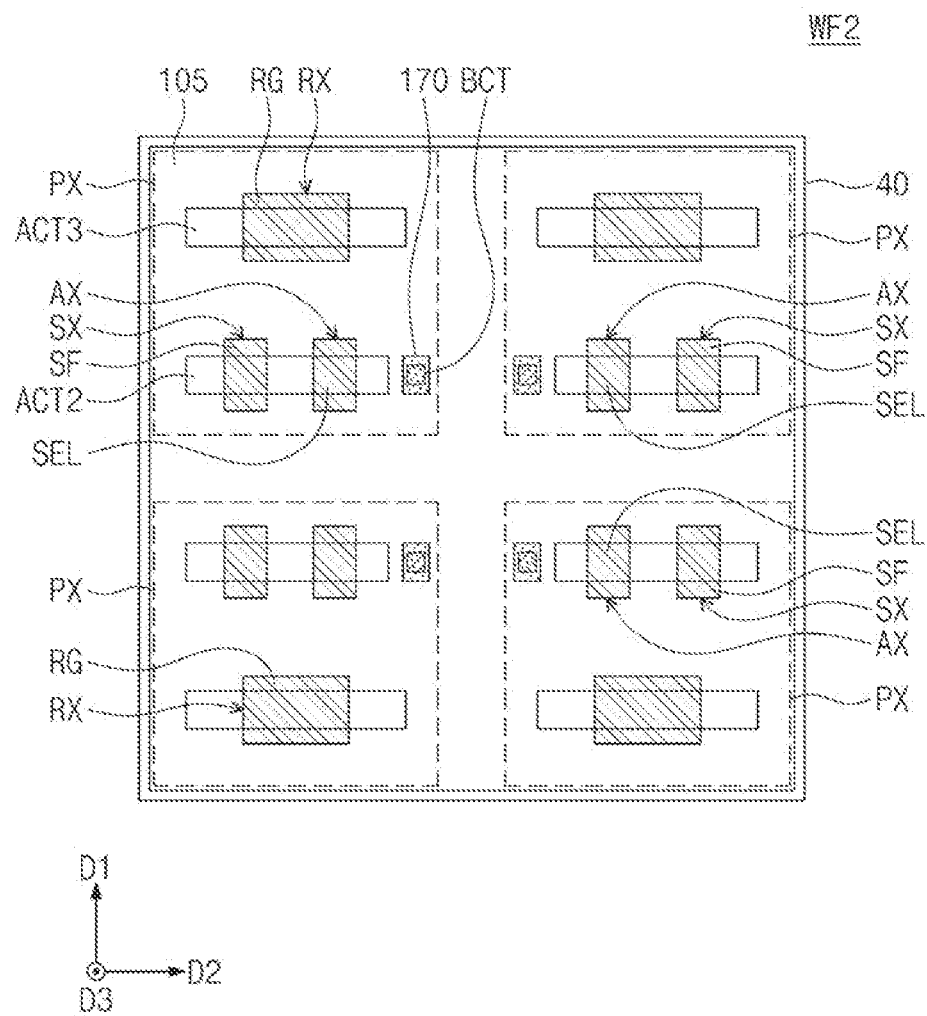
FIG. 6 is a plan view of a second wafer portion of the image sensor of FIG. 4.
Figure 7A:
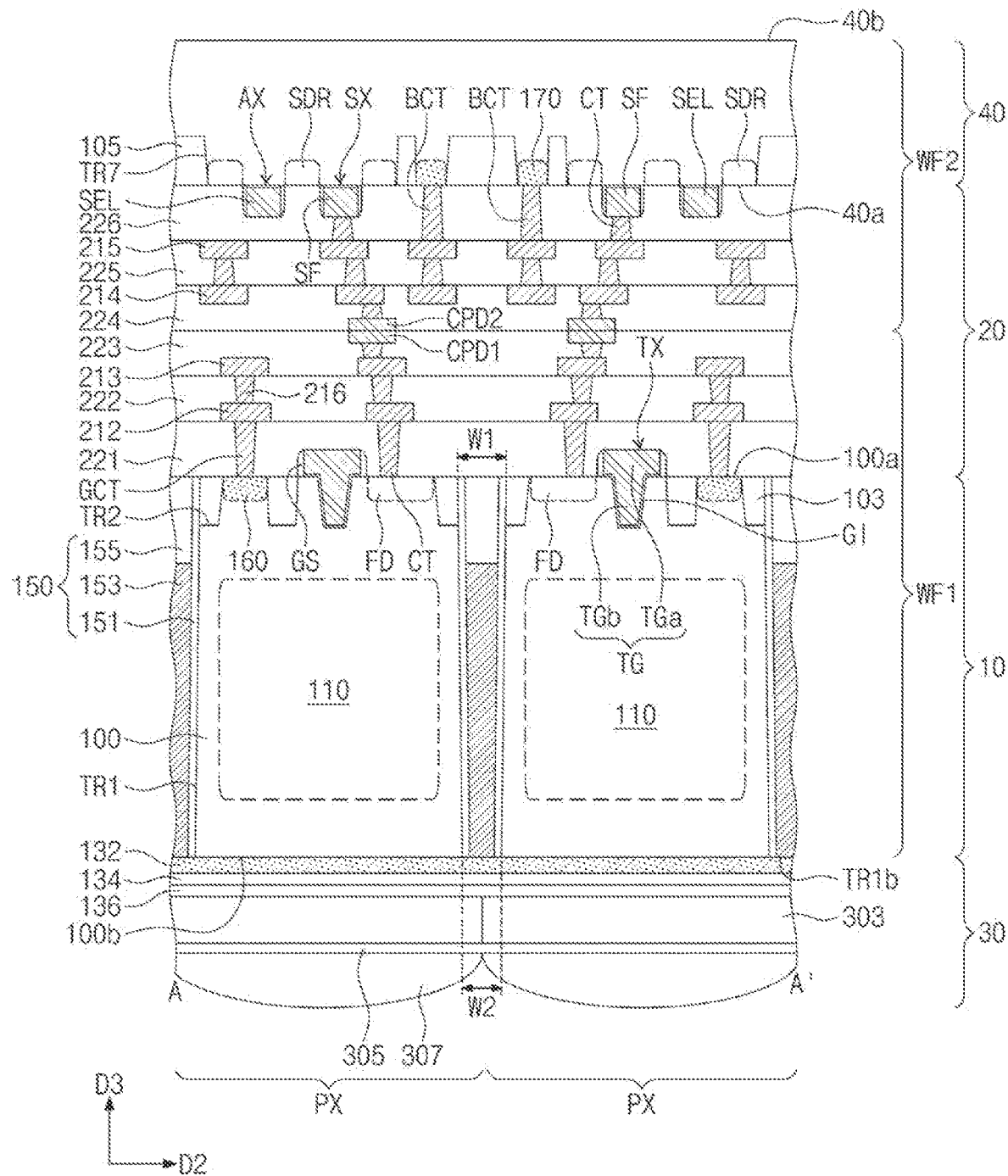
FIGS. 7A and 7B are sectional views taken along lines A-A' and B-B' of FIG. 4, respectively.
Figure 7B:
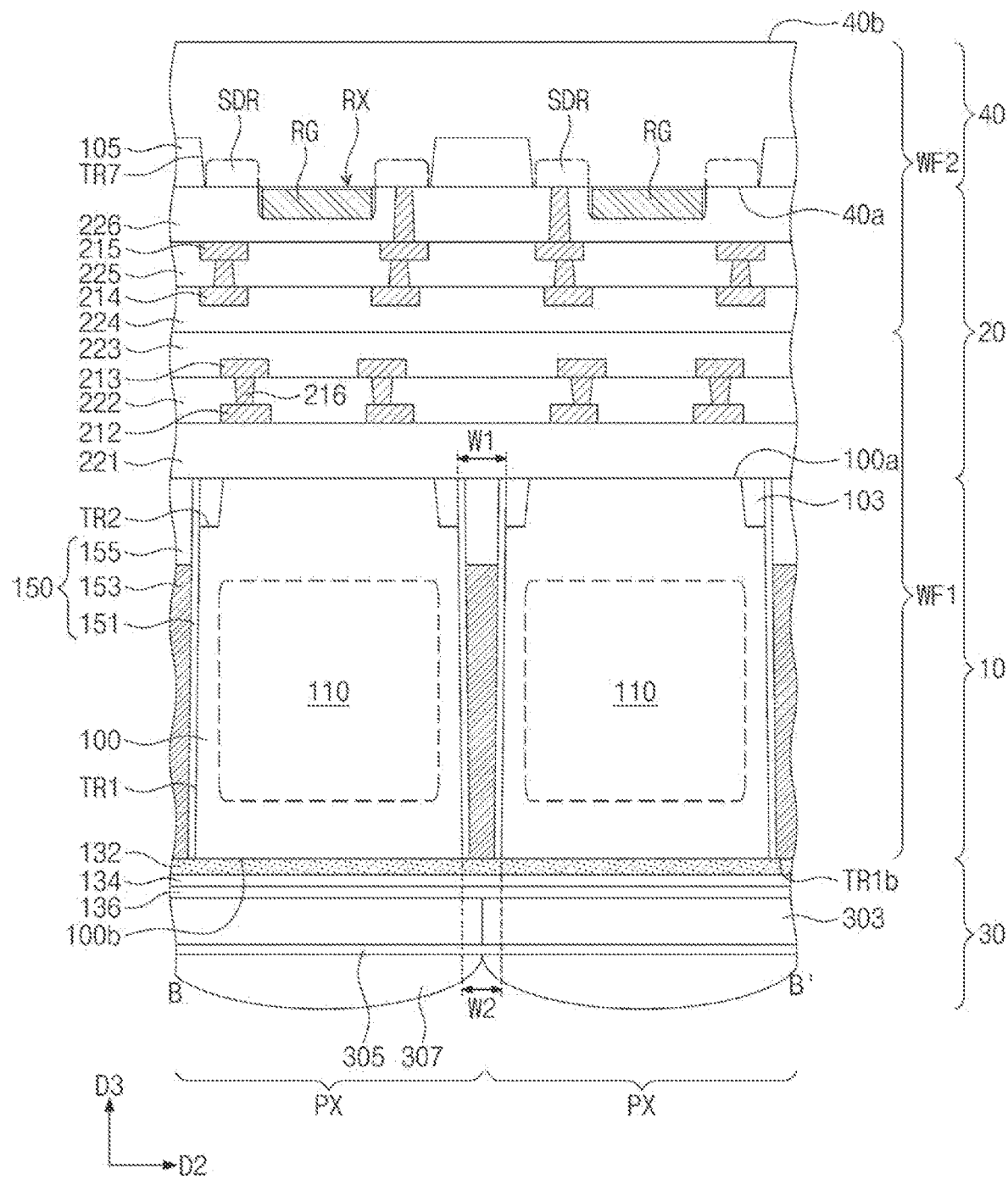

FIG. 4 is an enlarged plan view illustrating a portion 'M' of FIG. 2. FIG. 5 is a plan view of a first wafer portion of the image sensor of FIG. 4. FIG. 6 is a plan view of a second wafer portion of the image sensor of FIG. 4. Here, FIG. 4 may correspond to a layout diagram illustrating an over-lapped shape of the first and second wafer portions illustrated in FIGS. 5 and 6. FIGS. 7A and 7B are sectional views taken along lines A-A' and B-B' of FIG. 4, respectively.

Referring to FIGS. 4, 5, 6, 7A, and 7B, the image sensor may include the photoelectric conversion layer 10, the gate electrodes TG, RG, SEL, and SF, the first interconnection layer 20, the optically-transparent layer 30, and a second substrate 40. The image sensor may include a first wafer portion WF1 on the optically-transparent layer 30 and a second wafer portion WF2 on the first wafer portion WF1. The first wafer portion WF1 may include the photoelectric conversion layer 10 and first to third insulating layers 221, 222, and 223, which will be described below. The second wafer portion WF2 may include fourth to sixth insulating layers 224, 225, and 226, which will be described below, and the second substrate 40. The second wafer portion WF2 may cover the first wafer portion WF1.

The photoelectric conversion layer 10 may include the first substrate 100, the pixel isolation pattern 150, and the first device isolation pattern 103. The first substrate 100 may have a first or front surface 100a and a second or rear surface 100b that are opposite to each other. In the image sensor, light may be incident into the first substrate 100 through the second surface 100b. The first interconnection layer 20 may be disposed on the first surface 100a of the first substrate 100, and the optically-transparent layer 30 may be disposed on the second surface 100b of the first substrate 100. The first substrate 100 may be a semiconductor substrate. The semiconductor substrate may include, for example, a silicon substrate, a germanium substrate, or a silicon-germanium substrate. The first substrate 100 may include impurities of a first conductivity type. For example, the impurities of the first conductivity type may include p-type impurities, such as aluminum (Al), boron (B), indium (In) and/or gallium (Ga).

The first substrate 100 may include the unit pixel regions PX, which are defined by the pixel isolation pattern 150. The unit pixel regions PX may be arranged in two different directions (e.g., the first and second directions D1 and D2) to form a matrix-shaped arrangement. The first substrate 100 may include the photoelectric conversion regions 110. The photoelectric conversion regions 110 may be respectively provided in the unit pixel regions PX of the first substrate 100. For example, each unit pixel region PX may include a photoelectric conversion region 110. The photoelectric conversion regions 110 may be configured to have the same function and role as the photoelectric conversion region PD of FIG. 1. Each of the photoelectric conversion regions 110 may be a region of the first substrate 100 that is doped with impurities of the second conductivity type. The second conductivity type may be different from the first conductivity type. The impurity of the second conductivity type may include n-type impurities (e.g., phosphorus, arsenic, bismuth, and/or antimony). As an example, each of the photoelectric conversion regions 110 may include a first region adjacent to the first surface 100a and a second region adjacent to the second surface 100b. There may be a difference in impurity concentration between the first and second regions of the photoelectric conversion region 110. In this case, the photoelectric conversion region 110 may have a non-vanishing potential gradient between the first and second surfaces 100a and 100b of the first substrate 100. Alternatively, the photoelectric conversion region 110 may be provided to have no potential gradient between the first and second surfaces 100a and 100b of the first substrate 100.

The first substrate 100 and the photoelectric conversion region 110 may constitute a photodiode. For example, the first substrate 100 of the first conductivity type and the photoelectric conversion region 110 of the second conductivity type may form a pn junction serving as the photodiode. An amount of photocharges, which are produced and accumulated in the photoelectric conversion region 110 of the photodiode, may be proportional to an intensify of an incident light.

As shown in FIG. 4, the pixel isolation pattern 150 may be provided in the first substrate 100 to define the unit pixel regions PX. For example, the pixel isolation pattern 150 may be provided between the unit pixel regions PX of the first substrate 100. When viewed in a plan view, the pixel isolation pattern 150 may have a lattice or grid structure. When viewed in a plan view, the pixel isolation pattern 150 may be provided to surround each of the unit pixel regions PX and completely enclose each of the unit pixel regions PX. The pixel isolation pattern 150 may be provided in a first trench TR1, which is recessed from the first surface 100a of the first substrate 100. The pixel isolation pattern 150 may be extended from the first surface 100a of the first substrate 100 toward the second surface 100b. The pixel isolation pattern 150 may be a deep trench isolation (DTI) layer. The pixel isolation pattern 150 may be provided to penetrate the first substrate 100. A vertical height of the pixel isolation pattern 150 may be substantially equal to a vertical thickness of the first substrate 100. For example, a first surface of the pixel isolation pattern 150 may be coplanar with the first surface 100a of the first substrate 100, and a second surface of the pixel isolation pattern 150 may be coplanar with the second surface 100b of the first substrate 100. As an example, a width of the pixel isolation pattern 150 may gradually decrease in a direction from the first surface 100a of the first substrate 100 toward the second surface 100b. The width of the pixel isolation pattern 150 on the first surface 100a may be a first width W1, and the width of the pixel isolation pattern 150 on the second surface 100b may be a second width W2. In this case, the first width W1 may be greater than the second width W2. Terms such as "same," "equal," "planar," or "coplanar," as used herein, encompass near identicality including variations that may occur, for example, due to manufacturing processes. The term "substantially" may be used herein to emphasize this meaning, unless the context or other statements indicate otherwise.

The pixel isolation pattern 150 may include a first isolation pattern 151, a second isolation pattern 153, and a capping pattern 155. The first isolation pattern 151 may be provided along side surfaces of the first trench TR1. In an embodiment, the first isolation pattern 151 may be formed of or may include at least one of silicon-based insulating materials (e.g., silicon nitride, silicon oxide, and/or silicon oxynitride) and/or high-k dielectric materials (e.g., hafnium oxide and/or aluminum oxide). In an embodiment, the first isolation pattern 151 may include a plurality of layers formed of different materials. The first isolation pattern 151 may have a lower refractive index than the first substrate 100. In this case, it may be possible to prevent or suppress a cross-talk issue from occurring between the unit pixel regions PX of the first substrate 100.

The second isolation pattern 153 may be provided in the first isolation pattern 151. For example, side surfaces of the second isolation pattern 153 may be surrounded by the first isolation pattern 151. The first isolation pattern 151 may be interposed between the second isolation pattern 153 and the first substrate 100. The second isolation pattern 153 may be spaced apart from the first substrate 100 by the first isolation pattern 151. Accordingly, during the operation of the image sensor, the second isolation pattern 153 may be electrically separated from the first substrate 100. The second isolation pattern 153 may be formed of or may include a crystalline semiconductor material (e.g., poly-crystalline silicon). In an embodiment, the second isolation pattern 153 may further contain dopants of a first or second conductivity type. For example, the second isolation pattern 153 may be formed of or may include doped poly silicon. In another embodiment, the second isolation pattern 153 may be formed of or may include an undoped crystalline semiconductor material. For example, the second isolation pattern 153 may be formed of or may include undoped poly silicon. Here, the term "undoped" may mean that a doping process is intentionally omitted. The dopants may include n-type dopants and p-type dopants.

The capping pattern 155 may be provided on a top surface of the second isolation pattern 153. For example, a bottom surface of the capping pattern 155 may contact the top surface of the second isolation pattern 153. The capping pattern 155 may be disposed near the first surface 100a of the first substrate 100. A top surface of the capping pattern 155 may be coplanar with the first surface 100a of the first substrate 100. A bottom surface of the capping pattern 155 may be substantially coplanar with the top surface of the second isolation pattern 153. The capping pattern 155 may be formed of or may include at least one of non-conductive or insulating materials. As an example, the capping pattern 155 may be formed of or may include at least one of silicon-based insulating materials (e.g., silicon nitride, silicon oxide, and/or silicon oxynitride) and/or high-k dielectric materials (e.g., hafnium oxide and/or aluminum oxide). In this case, the pixel isolation pattern 150 may prevent photocharges, which are produced by light incident into each of the unit pixel regions PX, from entering neighboring ones of the unit pixel regions PX through a random drift phenomenon. For example, the pixel isolation pattern 150 may prevent a cross-talk issue between the unit pixel regions PX.

The first device isolation pattern 103 may be provided in the first substrate 100. For example, the first device isolation pattern 103 may be provided in a second trench TR2, which is recessed from the first surface 100a of the first substrate 100. The first device isolation pattern 103 may be a shallow trench isolation (STI) layer. The first device isolation pattern 103 may be provided to define first active patterns ACT1 in the first substrate 100 (e.g., see FIG. 5). The first device isolation pattern 103 may have a bottom surface that is placed in the first substrate 100. A width of the first device isolation pattern 103 may gradually decrease in a direction from the first surface 100a of the first substrate 100 toward the second surface 100b. The bottom surface of the first device isolation pattern 103 may be vertically spaced apart from the photoelectric conversion regions 110. The pixel isolation pattern 150 may be overlapped with a portion of the first device isolation pattern 103. For example, the first device isolation pattern 103 may horizontally overlap the capping pattern 155 of the pixel isolation pattern 150. At least a portion of the first device isolation pattern 103 may be disposed on and connected to an upper side surface of the pixel isolation pattern 150. For example, at least a portion of the first device isolation pattern 103 may contact a portion of a side surface of the first isolation pattern 151. Side and bottom surfaces of the first device isolation pattern 103 and a side surface of the pixel isolation pattern 150 may form a stepwise structure. A depth of the first device isolation pattern 103 may be smaller than a depth of the pixel isolation pattern 150. The first device isolation pattern 103 may be formed of or may include at least one of, for example, silicon oxide, silicon nitride, and/or silicon oxynitride.

Each of the unit pixel regions PX may include a first active pattern ACT1 defined by the first device isolation pattern 103. The first active pattern ACT1 may have a 'L' shape, when viewed in a plan view. However, the planar shape and the position of the first active pattern ACT1 are not limited to the example illustrated in FIGS. 4 and 5 and may be variously changed.

The transfer transistor TX previously described with reference to FIG. 1 may be provided on the first surface 100a of the first substrate 100. The transfer transistor TX may be provided on the first active pattern ACT1 of each of the unit pixel regions PX. The transfer transistor TX may be electrically connected to the photoelectric conversion region 110. The transfer transistor TX may include the transfer gate TG, which is provided on the first active pattern ACT1, and the floating diffusion region FD. The transfer gate TG may include a lower portion TGb, which is inserted into the first substrate 100, and an upper portion TGa, which is connected to the lower portion TGb and protrudes above the first surface 100a of the first substrate 100. A gate dielectric pattern GI may be interposed between the transfer gate TG and the first substrate 100. Gate spacers GS may be provided on opposite side surfaces of the upper portion TGa of the transfer gate TG. The floating diffusion region FD may be provided in a portion of the first active pattern ACT1 which is located at a side of the transfer gate TG. The floating diffusion region FD may have a second conductivity type (e.g., n-type) that is different from that of the first substrate 100.

Each of the unit pixel regions PX may include a first impurity region 160 provided in the first substrate 100. The first impurity region 160 may be adjacent to the first surface 100a of the first substrate 100. The first impurity region 160 may be provided in an upper portion of the first substrate 100. The first impurity region 160 may be adjacent to a portion of the first device isolation pattern 103. The first impurity region 160 may be provided at a side of the transfer gate TG, and the floating diffusion region FD may be provided at an opposite side of the transfer gate TG. The first device isolation pattern 103 may be provided between the first impurity region 160 and the transfer gate TG. In an embodiment, the first device isolation pattern 103 between the first impurity region 160 and the transfer gate TG may be omitted. A bottom surface of the first impurity region 160 may be spaced apart from the photoelectric conversion region 110 in the third direction D3. The first impurity region 160 may be a doped region. As an example, the first impurity region 160 may have the same conductivity type (e.g., the first conductivity type or the p-type) as the first substrate 100. The first impurity region 160 may be a ground (GND) region.

The second substrate 40 may be provided on the first substrate 100. The second substrate 40 may be provided on the first interconnection layer 20, which will be described again below. For example, the first interconnection layer 20 may be provided between the first substrate 100 and the second substrate 40. The second substrate 40 may be a semiconductor substrate or a silicon-on-insulator (SOI) substrate. The semiconductor substrate may include, for example, a silicon substrate, a germanium substrate, or a silicon-germanium substrate. The second substrate 40 may include a third surface 40a and a fourth surface 40b, which are opposite to each other. The third surface 40a may face the first surface 100a.

A second device isolation pattern 105 may be provided in the second substrate 40. For example, the second device isolation pattern 105 may be provided a seventh trench TR7, which is recessed from the third surface 40a of the second substrate 40. The second device isolation pattern 105 may be a shallow trench isolation (STI) layer. The second device isolation pattern 105 may be provided to define second active patterns ACT2 and third active patterns ACT3 in the second substrate 40 (e.g., see FIG. 6). The second device isolation pattern 105 may have a top surface that is placed in the second substrate 40. For example, the top surface of the second device isolation pattern 105 may be recessed from the third surface 40a of the second substrate 40 and a bottom surface of the second device isolation pattern 105 may be coplanar with the third surface 40a of the second substrate 40. A width of the second device isolation pattern 105 may gradually decrease in a direction from the third surface 40a of the second substrate 40 toward the fourth surface 40b (e.g., in the third direction D3). The second device isolation pattern 105 may be formed of or may include at least one of, for example, silicon oxide, silicon nitride, and/or silicon oxynitride.

The second substrate 40 may include the second active pattern ACT2 and the third active pattern ACT3 defined by the second device isolation pattern 105. The second and third active patterns ACT2 and ACT3 may be adjacent to the third surface 40a of the second substrate 40. The second and third active patterns ACT2 and ACT3 may be vertically overlapped with each of the unit pixel regions PX. Each of the second and third active patterns ACT2 and ACT3 may be a line-shaped pattern extending in the second direction D2. However, the planar shapes and the positions of the second and third active patterns ACT2 and ACT3 are not limited to the example illustrated in FIGS. 4 and 6 and may be variously changed.

The source follower transistor SX, the reset transistor RX, and the selection transistor AX previously described with reference to FIG. 1 may be provided on the third surface 40a of the second substrate 40. The transfer transistor TX may be provided on the first active pattern ACT1 of each of the unit pixel regions PX.

The gate electrodes SEL, SF, and RG may be provided on the third surface 40a of the second substrate 40. The gate electrodes SEL, SF, and RG may include the selection gate SEL, the source follower gate SF, and the reset gate RG. The source follower transistor SX and the selection transistor AX may be provided on the second active patterns ACT2. The source follower transistor SX may include the source follower gate SF on the second active pattern ACT2, and the selection transistor AX may include the selection gate SEL on the second active pattern ACT2. The reset transistor RX may be provided on the third active patterns ACT3. The reset transistor RX may include the reset gate RG on the third active pattern ACT3. The gate dielectric pattern GI may be interposed between the second substrate 40 and each of the selection gate SEL, the source follower gate SF, and the reset gate RG. The gate spacer GS may be provided on the side surface of each of the selection gate SEL, the source follower gate SF, and the reset gate RG.

Source/drain regions SDR may be provided in the second and third active patterns ACT2 and ACT3. Each of the selection transistor AX, the source follower transistor SX, and the reset transistor RX may include the source/drain region SDR. The source/drain region SDR may be provided at a side of each of the selection gate SEL, the source follower gate SF, and the reset gate RG. The source/drain region SDR may be adjacent to the third surface 40a of the second substrate 40. The source/drain region SDR may be a doped region. In an embodiment, the source/drain region SDR may have a different conductivity type (e.g., the second conductivity type or the n-type) from the first substrate 100.

A second impurity region 170 may be provided in the second substrate 40. The second impurity region 170 may be vertically overlapped with each of the unit pixel regions PX. The second impurity region 170 may be adjacent to the third surface 40a of the second substrate 40. The second impurity region 170 may be adjacent to a portion of the second device isolation pattern 105. The second device isolation pattern 105 may be provided between the second impurity region 170 and the source/drain region SDR. In an embodiment, the second device isolation pattern 105 may be omitted from the region between the second impurity region 170 and the source/drain region SDR. The second impurity region 170 may be a doped region. As an example, the second impurity region 170 may have the same conductivity type (e.g., the first conductivity type or the p-type) as the first substrate 100.

The first interconnection layer 20 may include insulating layers 221, 222, 223, 224, 225, and 226, interconnection lines 212, 213, 214, and 215, vias 216, contacts CT, ground contacts GCT, and body contacts BCT.

The insulating layers 221, 222, 223, 224, 225, and 226 may include a first insulating layer 221, a second insulating layer 222, a third insulating layer 223, a fourth insulating layer 224, a fifth insulating layer 225, and a sixth insulating layer 226. The insulating layers 221, 222, 223, 224, 225, and 226 may be referred to as interlayer insulating layers 221, 222, 223, 224, 225, and 226. The first to sixth insulating layers 221, 222, 223, 224, 225, and 226 may be sequentially stacked on the first surface 100a of the first substrate 100. The first insulating layer 221 may cover the first surface 100a of the first substrate 100. The sixth insulating layer 226 may cover the third surface 40a of the second substrate 40. The first insulating layer 221 may cover the transfer gate TG. The sixth insulating layer 226 may cover the selection gate SEL, the source follower gate SF, and the reset gate RG. Each of the first to sixth insulating layers 221, 222, 223, 224, 225, and 226 may be formed of or may include a non-conductive or insulating material. For example, each of the first to sixth insulating layers 221, 222, 223, 224, 225, and 226 may be formed of or may include at least one of silicon-based insulating materials (e.g., silicon oxide, silicon nitride, and/or silicon oxynitride).

The interconnection lines 212, 213, 214, and 215 may include first interconnection lines 212, second interconnection lines 213, third interconnection lines 214, and fourth interconnection lines 215. The first interconnection lines 212 may be provided in the second insulating layer 222. The second interconnection lines 213 may be provided in the third insulating layer 223. The third interconnection lines 214 may be provided in the fourth insulating layer 224. The fourth interconnection lines 215 may be provided in the fifth insulating layer 225. The first to fourth interconnection lines 212, 213, 214, and 215 may be electrically connected to each other through the vias 216.

The contacts CT may be provided in the first insulating layer 221 and the sixth insulating layer 226. The first to fourth interconnection lines 212, 213, 214, and 215 may be electrically connected to the transfer transistor TX, the source follower transistor SX, the reset transistor RX, and the selection transistor AX through the contacts CT. The first to fourth interconnection lines 212, 213, 214, and 215 may be electrically connected to the floating diffusion region FD or the source/drain region SDR through the contacts CT.

The ground contact GCT may be provided in the first insulating layer 221. The ground contact GCT may be provided to penetrate the first insulating layer 221 and may be coupled to the first impurity region 160. The ground contact GCT may be in contact with one of the first interconnection lines 212. The ground contact GCT may be a ground line, which is connected to the first impurity region 160 of the first substrate 100. The ground contact GCT may be used to apply a ground voltage to the first substrate 100.

The body contact BCT may be provided in the sixth insulating layer 226. The body contact BCT may be provided to penetrate the sixth insulating layer 226 and may be coupled to the second impurity region 170. The body contact BCT may be in contact with one of the fourth interconnection lines 215. The body contact BCT may be used to apply a negative voltage to the second substrate 40. The voltage applied through the body contact BCT may correspond to the body voltage $V_{BO}$ described with reference to FIG. 1. The ground contact GCT and the body contact BCT may be electrically separated from each other. Thus, the voltage, which is applied to the first substrate 100 through the ground contact GCT, may be different from the voltage, which is applied to the second substrate 40 through the body contact BCT.

According to an embodiment of the inventive concept, the ground contact GCT coupled to the first impurity region 160 of the first substrate 100 may be electrically separated from the body contact BCT coupled to the second impurity region 170 of the second substrate 40. Accordingly, it may be possible to apply two different voltages to the first and second substrates 100 and 40, respectively. In this case, it may be possible to increase operation voltage ranges of transistors, which are provided on the first and second substrates 100 and 40, and to increase a degree of freedom in operating the image sensor.

First conductive pads CPD1 and second conductive pads CPD2 may be provided in the third insulating layer 223 and the fourth insulating layer 224, respectively. The first conductive pad CPD1 in the third insulating layer 223 may be in contact with the second conductive pad CPD2 in the fourth insulating layer 224. The first substrate 100 and the second substrate 40 may be electrically connected to each other through the first and second conductive pads CPD1 and CPD2. As an example, the first conductive pad CPD1 may be electrically connected to the floating diffusion region FD, and the second conductive pad CPD2 may be electrically connected to the source follower gate SF.

The first to fourth interconnection lines 212, 213, 214, and 215, the vias 216, the contacts CT, the ground contacts GCT, the body contacts BCT, and the first and second conductive pads CPD1 and CPD2 may be formed of or may include at least one of metallic materials. As an example, each of the first to fourth interconnection lines 212, 213, 214, and 215, the vias 216, the contacts CT, the ground contacts GCT, the body contacts BCT, and the first and second conductive pads CPD1 and CPD2 may be formed of or may include copper (Cu).

The optically-transparent layer 30 may include color filters 303 and micro lenses 307. The optically-transparent layer 30 may be configured to collect and filter light, which is incident from the outside, and then to provide the light to the photoelectric conversion layer 10.

For example, the color filters 303 and the micro lenses 307 may be provided on the second surface 100b of the first substrate 100. The color filters 303 may be disposed on the unit pixel regions PX, respectively. The micro lenses 307 may be disposed on the color filters 303, respectively. For example, a color filter 303 and micro lens 307 may be provided on each unit pixel region PX. An anti-reflection layer 132 and first and second insulating layers 134 and 136 may be disposed between the second surface 100b of the first substrate 100 and the color filters 303. The anti-reflection layer 132 may be configured to prevent light, which is incident into the second surface 100b of the first substrate 100, from being reflected, and thus, the light may be effectively incident into the photoelectric conversion regions 110. A third insulating layer 305 may be disposed between the color filters 303 and the micro lenses 307.

The color filters 303 may include primary color filters. The color filters 303 may include first to third color filters having different colors from each other. In an embodiment, the first to third color filters may include green, red, and blue color filters, respectively. The first to third color filters may be arranged to form a Bayer pattern. In another embodiment, the first to third color filters may be provided to have other colors, such as cyan, magenta, or yellow.

The micro lenses 307 may have a convex shape, and in this case, it may be possible to more effectively condense light, which is incident into the unit pixel regions PX. When viewed in a plan view, the micro lenses 307 may be vertically and respectively overlapped with the photoelectric conversion regions 110.

FIGS. 8A to 8H are sectional views, which are taken along the line A-A' of FIG. 4 to illustrate a method of fabricating an image sensor, according to an embodiment of the inventive concept. The present embodiment will be described with reference to FIGS. 8A to 8H in conjunction with FIG. 4.

Figure 8A:
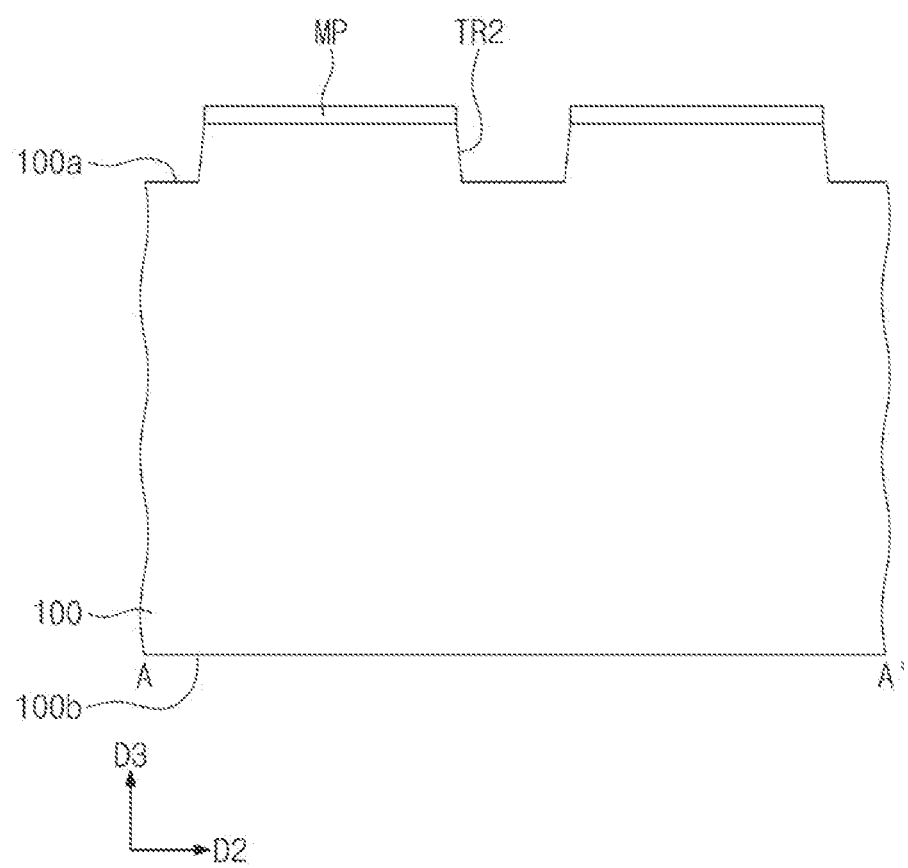
FIGS. 8A to 8H are sectional views, which are taken along the line A-A' of FIG. 4 to illustrate a method of fabricating an image sensor, according to an example embodiment of the inventive concept.

Referring to FIG. 8A, the first substrate 100 may be prepared, and in this case, the first substrate 100 may have the first surface 100a and the second surface 100b, which are opposite to each other. The first substrate 100 may include the pixel array region AR, the optical black region OB, and the pad region PAD. The first substrate 100 may contain impurities of the first conductivity type (e.g., p-type). As an example, the first substrate 100 may be provided to have a bulk silicon wafer (e.g., of the first conductivity type) and an epitaxial layer (e.g., of the first conductivity type) formed on the bulk silicon wafer. As another example, the first substrate 100 may be a bulk substrate including a well region of the first conductivity type.

The second trench TR2 may be formed on the first surface 100a of the first substrate 100. The formation of the second trench TR2 may include forming a mask pattern MP on the first surface 100a of the first substrate 100 and performing an etching process on the first surface 100a using the mask pattern MP.

Figure 8B:
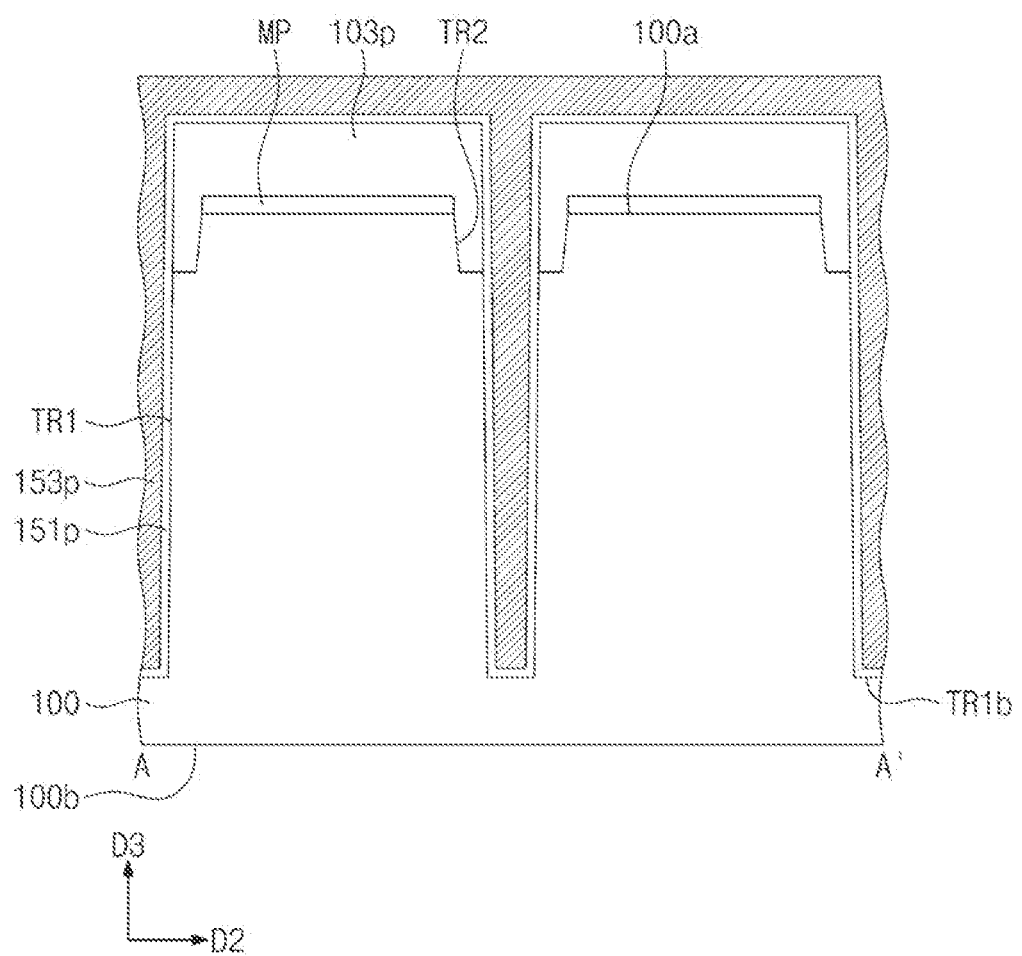

Referring to FIG. 8B, the first trench TR1 may be formed on the first surface 100a of the first substrate 100. In an embodiment, a preliminary device isolation pattern 103p may be formed on the first surface 100a of the first substrate 100, before the formation of the first trench TR1. The preliminary device isolation pattern 103p may be formed by performing a deposition process on the first surface 100a of the first substrate 100. The preliminary device isolation pattern 103p may be formed to fully fill the second trench TR2 and to cover the mask pattern MP. A top surface of the preliminary device isolation pattern 103p may be formed at a level higher than the first surface 100a of the first substrate 100. The first trench TR1 may be formed by forming a first mask (not shown) on the preliminary device isolation pattern 103p and then anisotropically etching the preliminary device isolation pattern 103p and the first substrate 100. A bottom surface TR1b of the first trench TR1 may be located at a level higher than the second surface 100b of the first substrate 100. The preliminary device isolation pattern 103p may be formed of or may include at least one of, for example, silicon oxide, silicon nitride, and/or silicon oxynitride.

After the formation of the first trench TR1, a first preliminary isolation pattern 151p may be formed to conformally cover an inner surface of the first trench TR1. The first preliminary isolation pattern 151p may be formed to cover the inner surface of the first trench TR1 and a top surface of the preliminary device isolation pattern 103p. The first preliminary isolation pattern 151p may be formed by depositing an insulating material on the first substrate 100, in which the first trench TR1 is formed. The first preliminary isolation pattern 151p may be formed of or may include at least one of, for example, silicon oxide, silicon nitride, and/or silicon oxynitride.

A second preliminary isolation pattern 153p may be formed on the first preliminary isolation pattern 151p. The second preliminary isolation pattern 153p may be formed by performing a deposition process on the first substrate 100 provided with the first preliminary isolation pattern 151p. The second preliminary isolation pattern 153p may be formed to fill the first trench TR1 covered with the first preliminary isolation pattern 151p and to cover the top surface of the preliminary device isolation pattern 103p covered with the first preliminary isolation pattern 151p. The second preliminary isolation pattern 153p may be formed of or may include, for example, poly silicon.

Figure 8C:
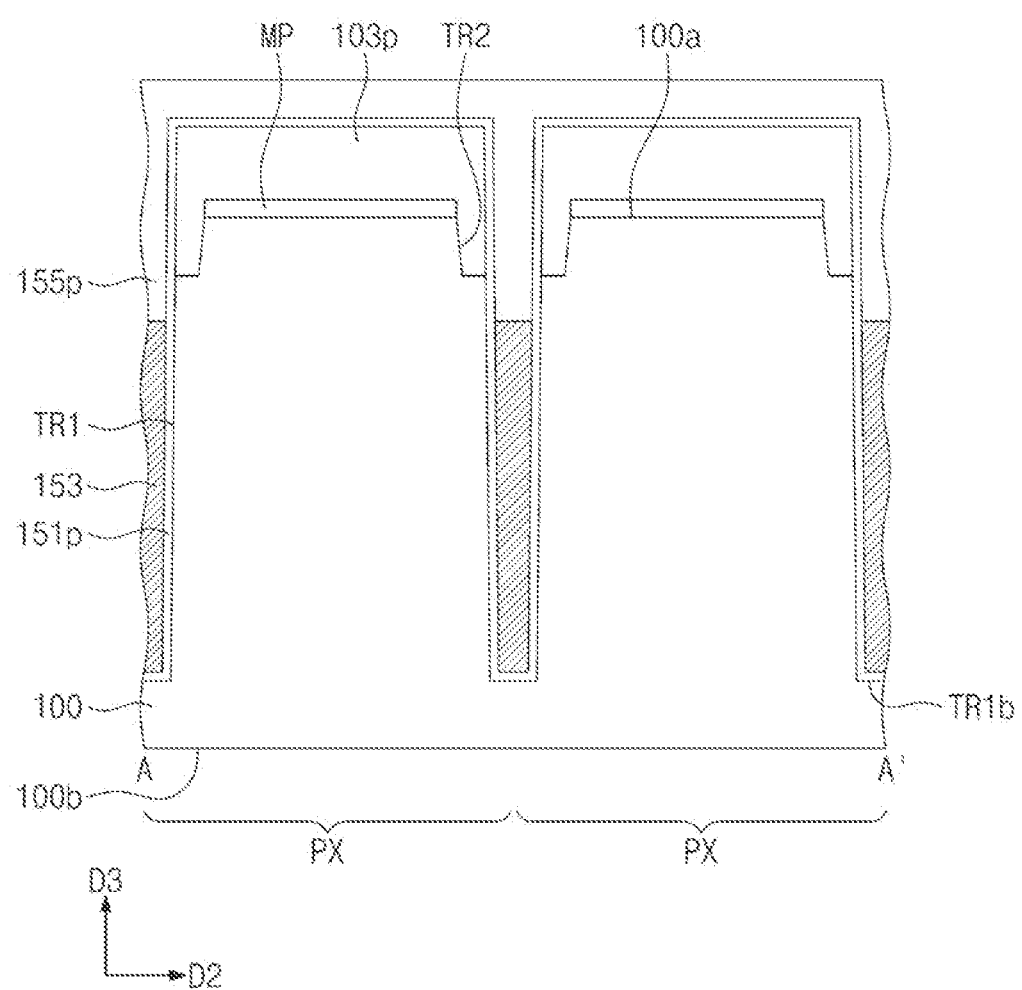

Referring to FIG. 8C, a first etching process may be performed to remove an upper portion of the second preliminary isolation pattern 153p and thereto to form the second isolation pattern 153. As a result, a portion of the first preliminary isolation pattern 151p may be exposed to the outside. The first etching process may be performed to lower the top surface of the second isolation pattern 153 to a level lower than a bottom surface of the preliminary device isolation pattern 103p.

According to an embodiment of the inventive concept, a doping process may be performed on the second isolation pattern 153, after the first etching process. The doping process may be, for example, a beam line ion implantation process or a plasma doping process (PLAD). For the plasma doping process, a source material in a gaseous state may be supplied into a process chamber. Then, the source material may be ionized to produce plasma and the ionized source materials may be injected into the second isolation pattern 153 by applying a bias of high voltage to an electrostatic chuck (not shown), on which the first substrate 100 is loaded. In the case where the plasma doping process is used, it may be possible to realize a uniform doping profile even at a deep level and to reduce a process time for the doping process. For the beam-line ion implantation process, it may be difficult to reduce a vertical variation in doping concentration of the second isolation pattern 153, because the first trench TR1 has a relatively small width and a relatively large depth. Accordingly, in the case where the doping process is performed using the beam-line ion implantation process, a concentration of impurities in the second isolation pattern 153 may vary depending on a vertical depth. A dark current property of the image sensor may be improved by applying a negative voltage to the second isolation pattern 153.

A preliminary capping pattern 155p may be formed to cover the entire top surface of the first substrate 100 and to fill an upper portion of the first trench TR1. The formation of the preliminary capping pattern 155p may include performing a deposition process on the first surface 100a of the first substrate 100. The preliminary capping pattern 155p may be formed of or may include at least one of silicon oxide, silicon nitride, and/or silicon oxynitride.

Figure 8D:
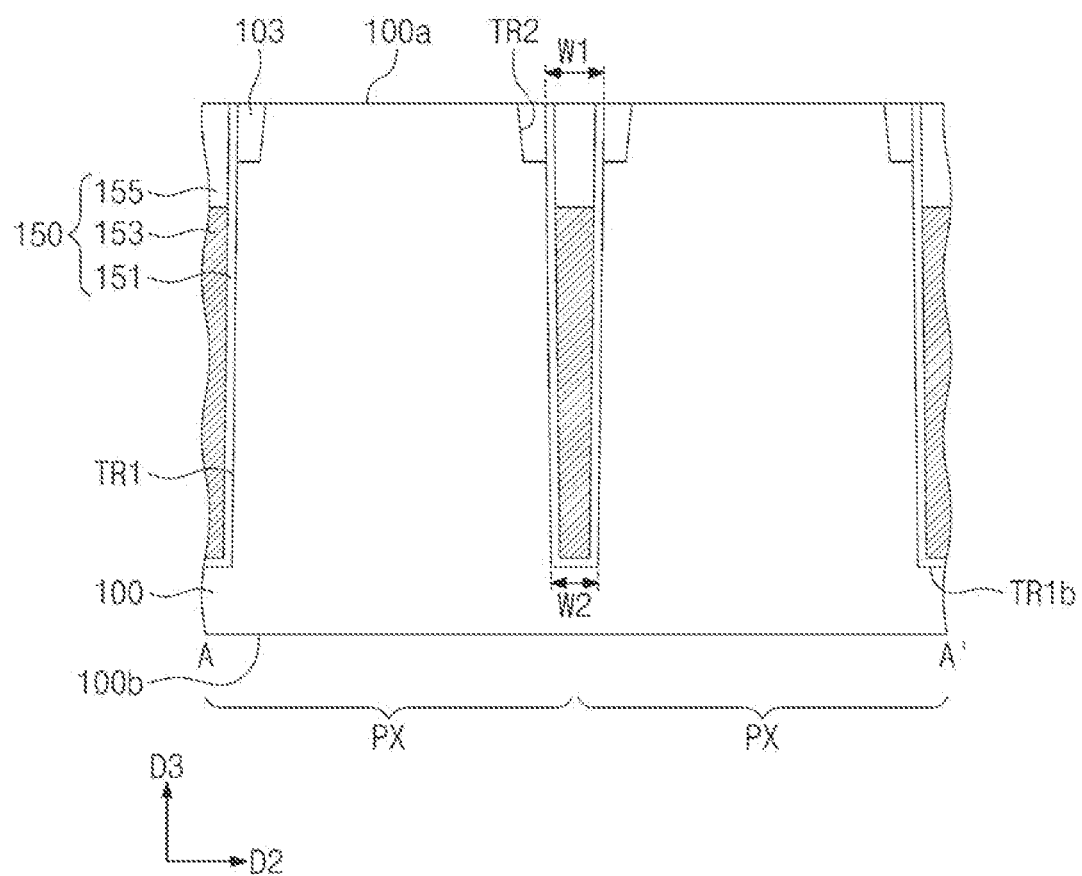

Referring to FIG. 8D, the capping pattern 155 and the first device isolation pattern 103 may be formed. The formation of the capping pattern 155 and the first device isolation pattern 103 may include performing a planarization process on the preliminary capping pattern 155p and the preliminary device isolation pattern 103p to expose the mask pattern MP on the first surface 100a of the first substrate 100. In an embodiment, the mask pattern MP may be removed after the planarization process. Thus, it may be possible to prevent the first surface 100a of the first substrate 100 from being damaged by the planarization process. As a result of the planarization process, the first active pattern ACT1 may be formed to have the structure described with reference to FIGS. 4 and 5.

Figure 8E:
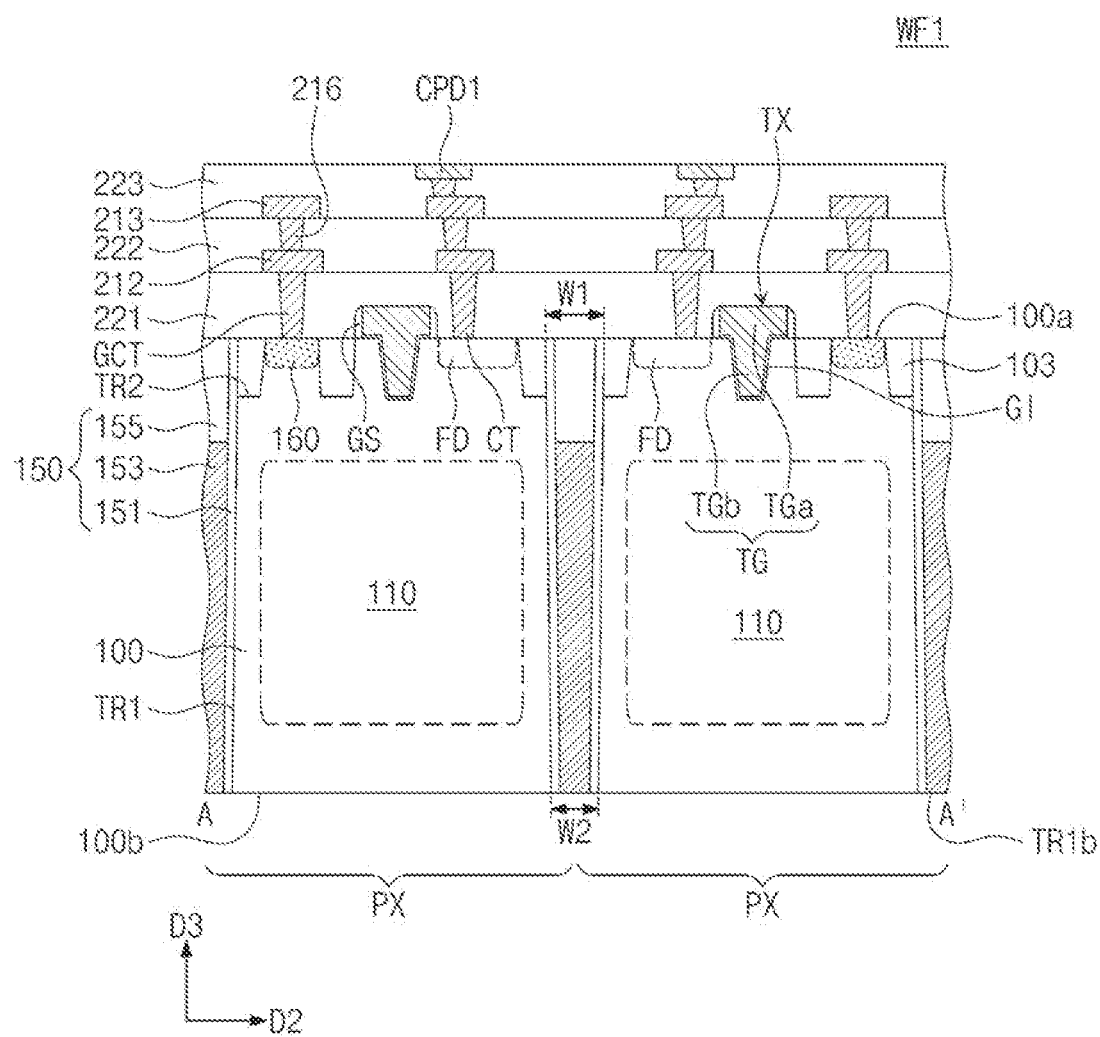

Referring to FIG. 8E, the photoelectric conversion regions 110 may be formed by doping the unit pixel regions PX with impurities. The photoelectric conversion regions 110 may be formed to have a second conductivity type (e.g., n-type), which is different from the first conductivity type (e.g., p-type). In an embodiment, a thinning process may be performed to remove a portion of the first substrate 100 or to reduce a vertical thickness of the first substrate 100. The thinning process may include grinding or polishing the second surface 100b of the first substrate 100 and anisotropically or isotropically etching the second surface 100b of the first substrate 100. The first substrate 100 may be inverted, for the thinning process. In an embodiment, the grinding or polishing process may be performed to remove a portion of the first substrate 100, and then, the anisotropic or isotropic etching process may be performed to remove surface defects from the first substrate 100.

As a result of the thinning process on the second surface 100b of the first substrate 100, the bottom surfaces of the first and second isolation patterns 151 and 153 may be exposed. The bottom surfaces of the first and second isolation patterns 151 and 153 may be located at substantially the same level as the second surface 100b of the first substrate 100.

The transfer transistor TX may be formed on the first active pattern ACT1 of each of the unit pixel regions PX. For example, the formation of the transfer transistor TX may include forming the floating diffusion region FD by doping the first active pattern ACT1 with impurities and forming the transfer gate TG on the first active pattern ACT1.

The first impurity region 160 may be formed in each of the unit pixel regions PX. The formation of the first impurity region 160 may include doping a portion of the first substrate 100 with p-type impurities.

The first insulating layer 221 may be formed on the first surface 100a of the first substrate 100. The first insulating layer 221 may be formed to cover the transfer transistor TX, which is formed on the first surface 100a of the first substrate 100.

The contacts CT and the ground contacts GCT may be formed in the first insulating layer 221. The contacts CT and the ground contacts GCT may be formed to penetrate the first insulating layer 221. The contact CT may be electrically connected to the floating diffusion region FD. Although not shown, the contact CT may be electrically connected to the transfer gate TG. The ground contact GCT may be coupled to the first impurity region 160.

The first interconnection lines 212 may be formed on the first insulating layer 221. The second insulating layer 222 may be formed on the first interconnection lines 212. The second insulating layer 222 may cover top and side surfaces of the first interconnection lines 212. The vias 216 may be formed to penetrate the second insulating layer 222. The second interconnection lines 213 may be formed on the second insulating layer 222. The third insulating layer 223 may be formed on the second interconnection lines 213. The third insulating layer 223 may be formed to cover top and side surfaces of the second interconnection lines 213. The vias 216 and the first conductive pad CPD1 may be formed in the third insulating layer 223. In an embodiment, a top surface of the first conductive pad CPD1 may be exposed to the outside of the third insulating layer 223. For example, the top surface of the first conductive pad CPD1 may be coplanar with a top surface of the third insulating layer 223. The first and second interconnection lines 212 and 213, the vias 216, the contacts CT, the ground contacts GCT, and the first conductive pad CPD1 may be formed of or may include, for example, copper (Cu). As a result, the first wafer portion WF1 may be fabricated.

Figure 8F:
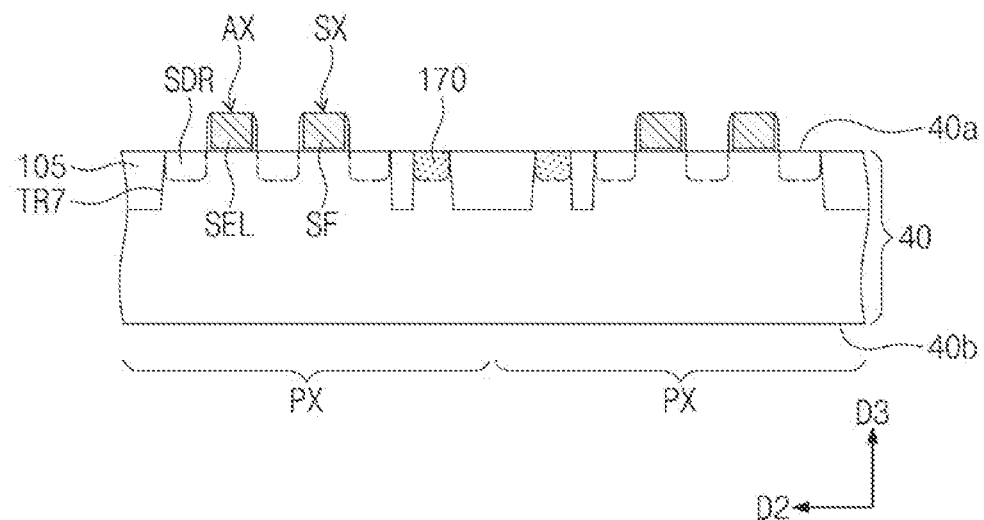

Referring to FIG. 8F, the second substrate 40 having the third surface 40a and the fourth surface 40b, which are opposite to each other, may be prepared. The second substrate 40 may be a semiconductor substrate. The semiconductor substrate may include, for example, a silicon substrate, a germanium substrate, or a silicon-germanium substrate.

The second device isolation pattern 105 may be formed near the third surface 40a of the second substrate 40. For example, the formation of the second device isolation pattern 105 may include forming a mask pattern on the third surface 40a of the second substrate 40, performing an etching process, in which the mask pattern is used as an etch mask, on the third surface 40a to form the seventh trench TR7, filling the seventh trench TR7 with an insulating material, and performing a planarization process on the insulating material. As a result of the formation of the second device isolation pattern 105, the second and third active patterns ACT2 and ACT3 described with reference to FIGS. 4 and 6 may be formed.

The selection transistor AX and the source follower transistor SX may be formed on the second active pattern ACT2. Although not shown, the reset transistor may be formed on the third active pattern ACT3. For example, the formation of the selection transistor AX and the source follower transistor SX may include doping the second active pattern ACT2 with impurities to form the source/drain region SDR and forming the selection gate SEL and the source follower gate SF on the second active pattern ACT2.

The second impurity region 170 may be formed in the second substrate 40. For example, the formation of the second impurity region 170 may include doping a portion of the second substrate 40 with p-type impurities.

Figure 8G:
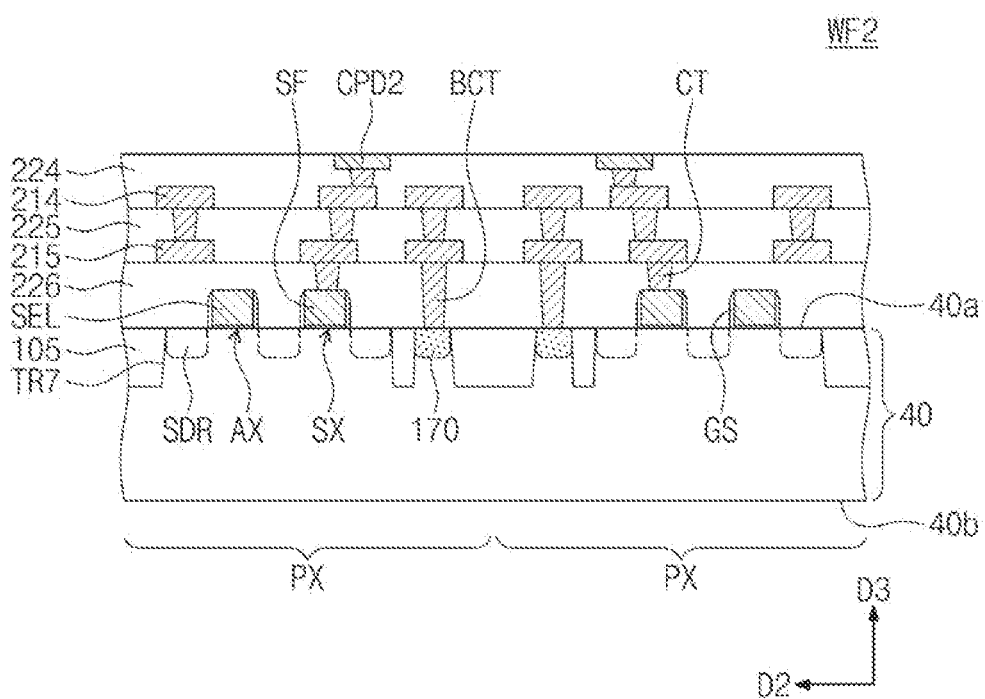

Referring to FIG. 8G, the sixth insulating layer 226 may be formed to cover the third surface 40a of the second substrate 40. The contacts CT and the body contacts BCT may be formed to penetrate the sixth insulating layer 226. The contact CT may be electrically connected to at least one of the selection gate SEL or the source follower gate SF. Although not shown, the contact CT may be electrically connected to the reset gate RG. The body contact BCT may be coupled to the second impurity region 170.

The fourth interconnection lines 215 may be formed on the sixth insulating layer 226. The fifth insulating layer 225 may be formed on the fourth interconnection lines 215. The fifth insulating layer 225 may be formed to cover top and side surfaces of the fourth interconnection lines 215. The vias 216 may be formed to penetrate the fifth insulating layer 225. The third interconnection lines 214 may be formed on the fifth insulating layer 225. The fourth insulating layer 224 may be formed on the third interconnection lines 214. The fourth insulating layer 224 may be formed to cover top and side surfaces of the third interconnection lines 214. The vias 216 and the second conductive pad CPD2 may be formed in the fourth insulating layer 224. In an embodiment, a top surface of the second conductive pad CPD2 may be exposed to the outside of the fourth insulating layer 224. Third and fourth interconnection lines 214 and 215, the vias 216, the contacts CT, the body contacts BCT, and the second conductive pad CPD2 may be formed of or may include, for example, copper (Cu). As a result, the second wafer portion WF2 may be fabricated.

Figure 8H:
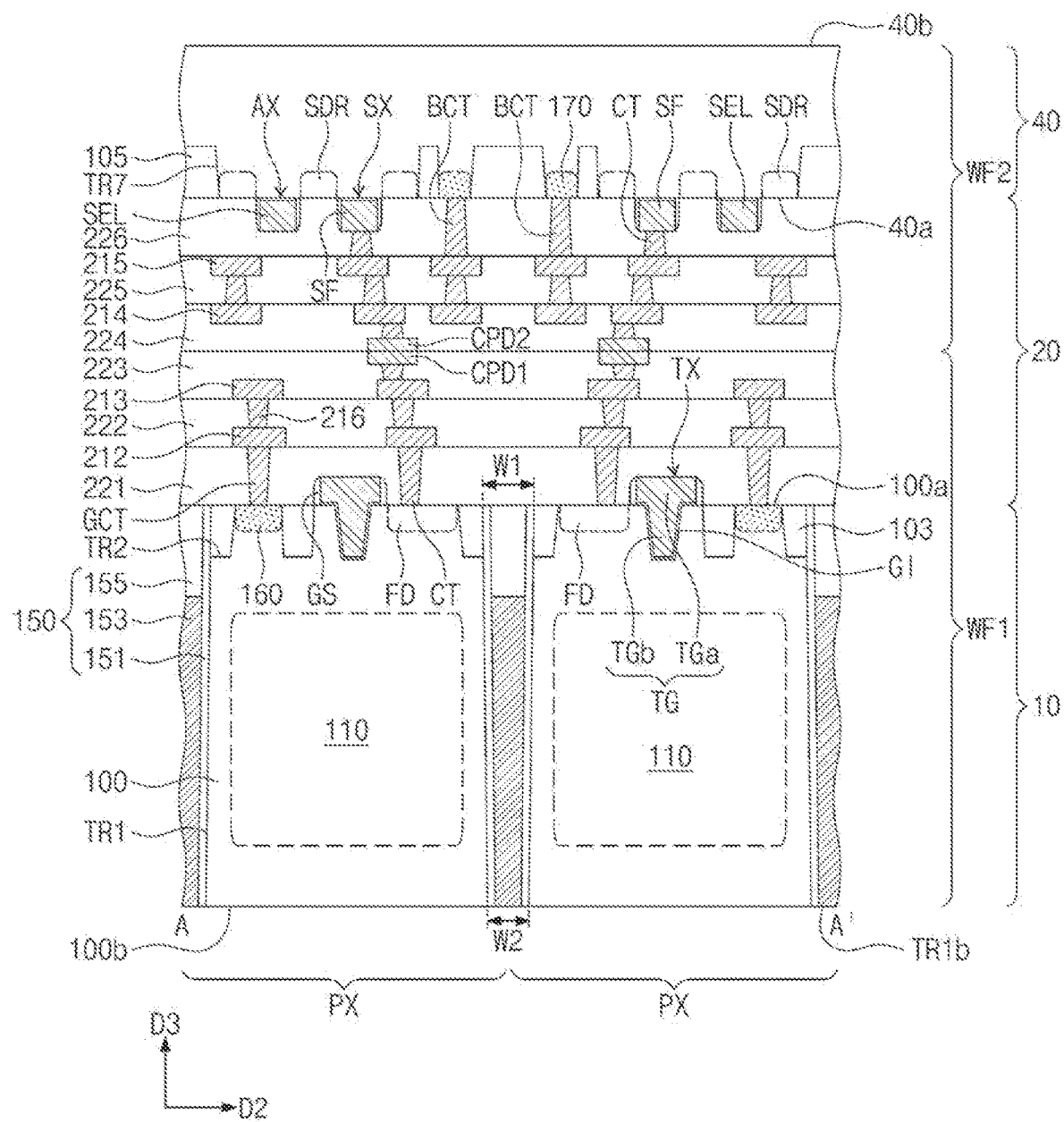

Referring to FIG. 8H, the second wafer portion WF2 may be inverted and may be placed on the first wafer portion WF1. The second wafer portion WF2 may be placed such that the second conductive pad CPD2 is in contact with the first conductive pad CPD1 of the first wafer portion WF1, and then, a thermocompression process or the like may be performed to bond the second wafer portion WF2 to the first wafer portion WF1. As a result, the first substrate 100 of the first wafer portion WF1 may be electrically connected to the second substrate 40 of the second wafer portion WF2. As an example, the floating diffusion region FD of the first substrate 100 may be electrically connected to the source follower gate SF on the second substrate 40.

Referring back to FIG. 7A, the anti-reflection layer 132, the first insulating layer 134, and the second insulating layer 136 may be sequentially formed on the second surface 100b of the first substrate 100. The color filters 303 may be formed on the unit pixel regions PX, respectively. The third insulating layer 305 may be formed on the color filters 303. The micro lenses 307 may be formed on the third insulating layer 305 to be overlapped with the unit pixel regions PX, respectively.

Referring back to FIG. 3, the image sensor may further include the logic chip 2000. The logic chip 2000 may include a third substrate 46 and a second interconnection layer 45. The second interconnection layer 45 may be interposed between the second substrate 40 and the third substrate 46.

A first connection structure 50, a first pad terminal 81, and a bulk color filter 90 may be provided on the first substrate 100 and in the optical black region OB. The first connection structure 50 may include a first light-blocking pattern 51, a first insulating pattern 53, and a first capping pattern 55. The first light-blocking pattern 51 may be provided on the second surface 100b of the first substrate 100. The first light-blocking pattern 51 may be provided to cover the second insulating layer 136 on the second surface 100b and to conformally cover inner surfaces of third and fourth trenches TR3 and TR4. The first light-blocking pattern 51 may be provided to penetrate the photoelectric conversion layer 10, the first interconnection layer 20, and the second substrate 40 and may electrically connect the photoelectric conversion layer 10 to the first interconnection layer 20. In detail, the first light-blocking pattern 51 may be in contact with interconnection lines in the first interconnection layer 20 and may be also in contact with the pixel isolation pattern 150 in the photoelectric conversion layer 10. Thus, the first connection structure 50 may be electrically connected to the interconnection lines in the first interconnection layer 20. The first light-blocking pattern 51 may be formed of or may include at least one of metallic materials (e.g., tungsten (W)). The first light-blocking pattern 51 may prevent light from being incident into the optical black region OB.

The first pad terminal 81 may be provided in the third trench TR3 to fill a remaining space of the third trench TR3. The first pad terminal 81 may be formed of or may include at least one of metallic materials (e.g., aluminum (Al)). The first pad terminal 81 may be connected to the pixel isolation pattern 150 (in particular, the second isolation pattern 153). Thus, a negative voltage may be applied to the pixel isolation pattern 150 through the first pad terminal 81.

The first insulating pattern 53 may be provided on the first light-blocking pattern 51 to fill a remaining space of the fourth trench TR4. The first insulating pattern 53 may be provided to penetrate the photoelectric conversion layer 10, the first interconnection layer 20, and the second substrate 40. The first capping pattern 55 may be provided on the first insulating pattern 53.

The bulk color filter 90 may be provided on the first pad terminal 81, the first light-blocking pattern 51, and the first capping pattern 55. The bulk color filter 90 may cover the first pad terminal 81, the first light-blocking pattern 51, and the first capping pattern 55. A first protection layer 71 may be provided on the bulk color filter 90 to cover the bulk color filter 90. For example, the first protection layer 71 may contact top and side surfaces of the bulk color filter 90.

A photoelectric conversion region 110' and the dummy region 111 may be provided in the optical black region OB of the first substrate 100. The photoelectric conversion region 110' may be doped to have a conductivity type (e.g., the second conductivity type) that is different from the first conductivity type. The second conductivity type may be, for example, an n-type. The photoelectric conversion region 110' may have a structure similar to the photoelectric conversion region 110 described with reference to FIG. 7A but may not be used to convert light to an electrical signal. The dummy region 111 may be an undoped region. A signal produced in the photoelectric conversion region 110' and the dummy region 111 may be used as information for removing a process noise.

A second connection structure 60, a second pad terminal 83, and a second protection layer 73 may be provided in the pad region PAD and on the first substrate 100. The second connection structure 60 may include a second light-blocking pattern 61, a second insulating pattern 63, and a second capping pattern 65.

The second light-blocking pattern 61 may be provided on the second surface 100b of the first substrate 100. More specifically, the second light-blocking pattern 61 may be provided to cover the second insulating layer 136 on the second surface 100b and to conformally cover inner surfaces of fifth and sixth trenches TR5 and TR6. The second light-blocking pattern 61 may be provided to penetrate the photoelectric conversion layer 10, the first interconnection layer 20, and at least a portion of the second substrate 40. More specifically, the second light-blocking pattern 61 may be in contact with interconnection lines 231 and 232, which are provided in the second interconnection layer 45. The second light-blocking pattern 61 may be formed of or may include at least one of metallic materials (e.g., tungsten (W)).

The second pad terminal 83 may be provided in the fifth trench TR5. The second pad terminal 83 may be provided on the second light-blocking pattern 61 to fill a remaining portion of the fifth trench TR5. The second pad terminal 83 may be formed of or may include at least one of metallic materials (e.g., aluminum (Al)). The second pad terminal 83 may be used as an electric conduction path between the image sensor device and the outside. The second insulating pattern 63 may be formed to fill the remaining space of the sixth trench TR6. The second insulating pattern 63 may penetrate the photoelectric conversion layer 10, the first interconnection layer 20, and at least a portion of the second substrate 40. The second capping pattern 65 may be provided on the second insulating pattern 63. The second protection layer 73 may be formed to cover a portion of the second light-blocking pattern 61 and the second capping pattern 65. For example, the second protection layer 73 may contact a top surface of the second light-blocking pattern 61 and top and side surfaces of the second capping pattern 65.

A current, which is applied through the second pad terminal 83, may be delivered to the pixel isolation pattern 150 through the second light-blocking pattern 61, the interconnection lines 231 and 232 in the second interconnection layer 45, and the first light-blocking pattern 51. Electrical signals produced from the photoelectric conversion regions 110 and 110' and the dummy region 111 may be delivered to the outside through the interconnection lines of the first interconnection layer 20, the interconnection lines 231 and 232 in the second interconnection layer 45, the second light-blocking pattern 61, and the second pad terminal 83.

Figure 9A:
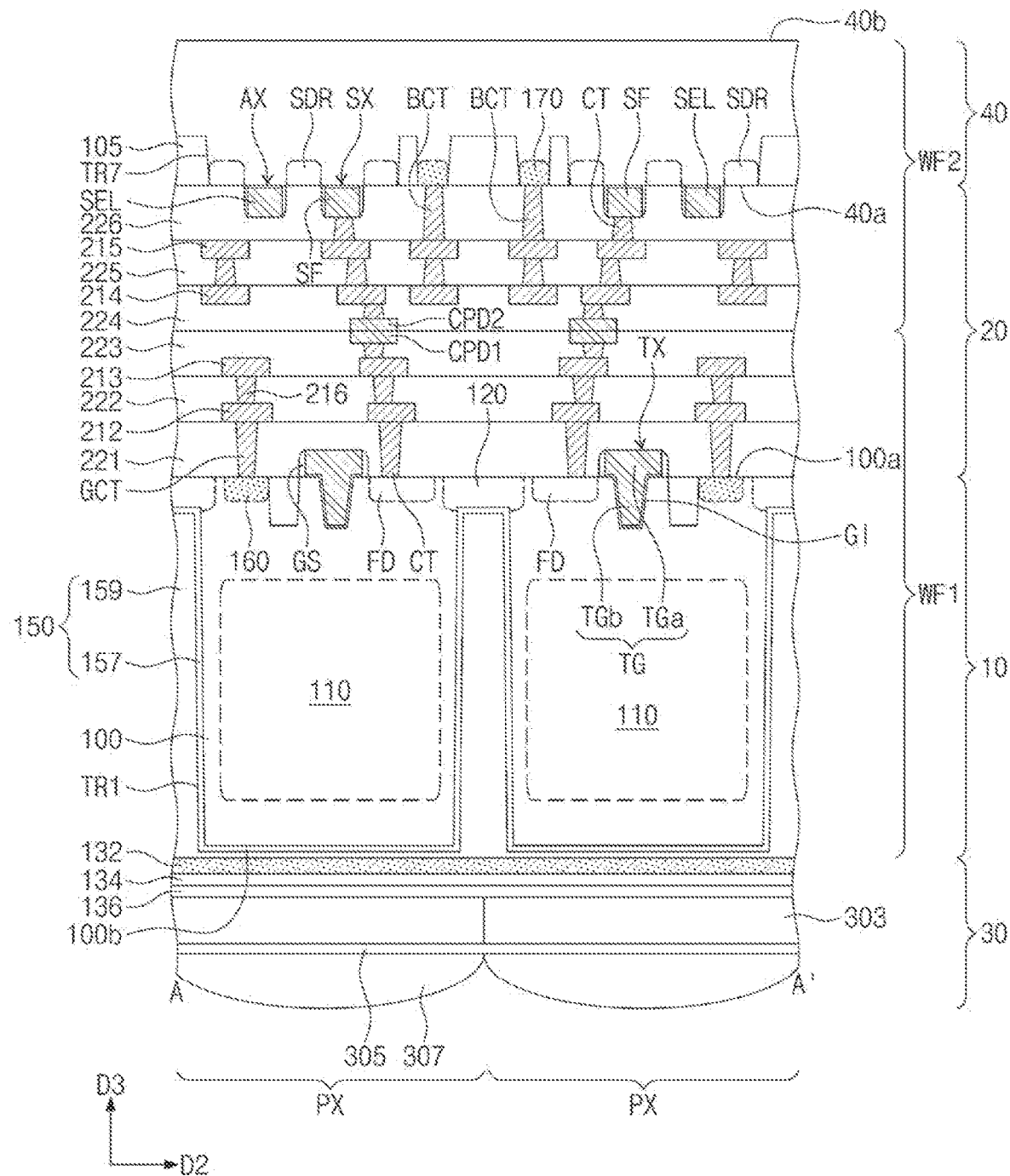
FIGS. 9A to 9C are sectional views, which are taken along the line A-A' of FIG. 4 to illustrate an image sensor, according to an example embodiment of the inventive concept.
Figure 9B:
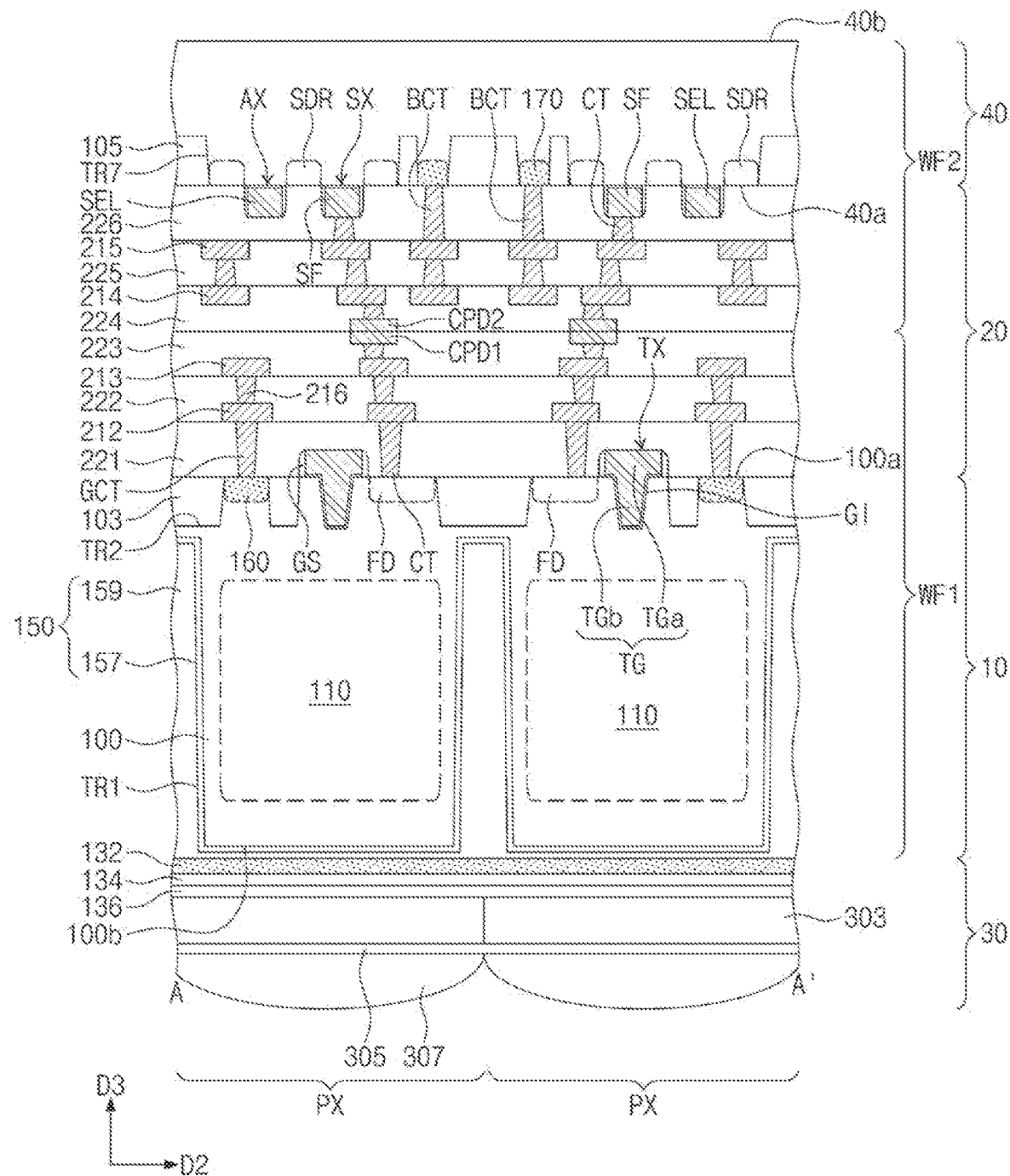
Figure 9C:
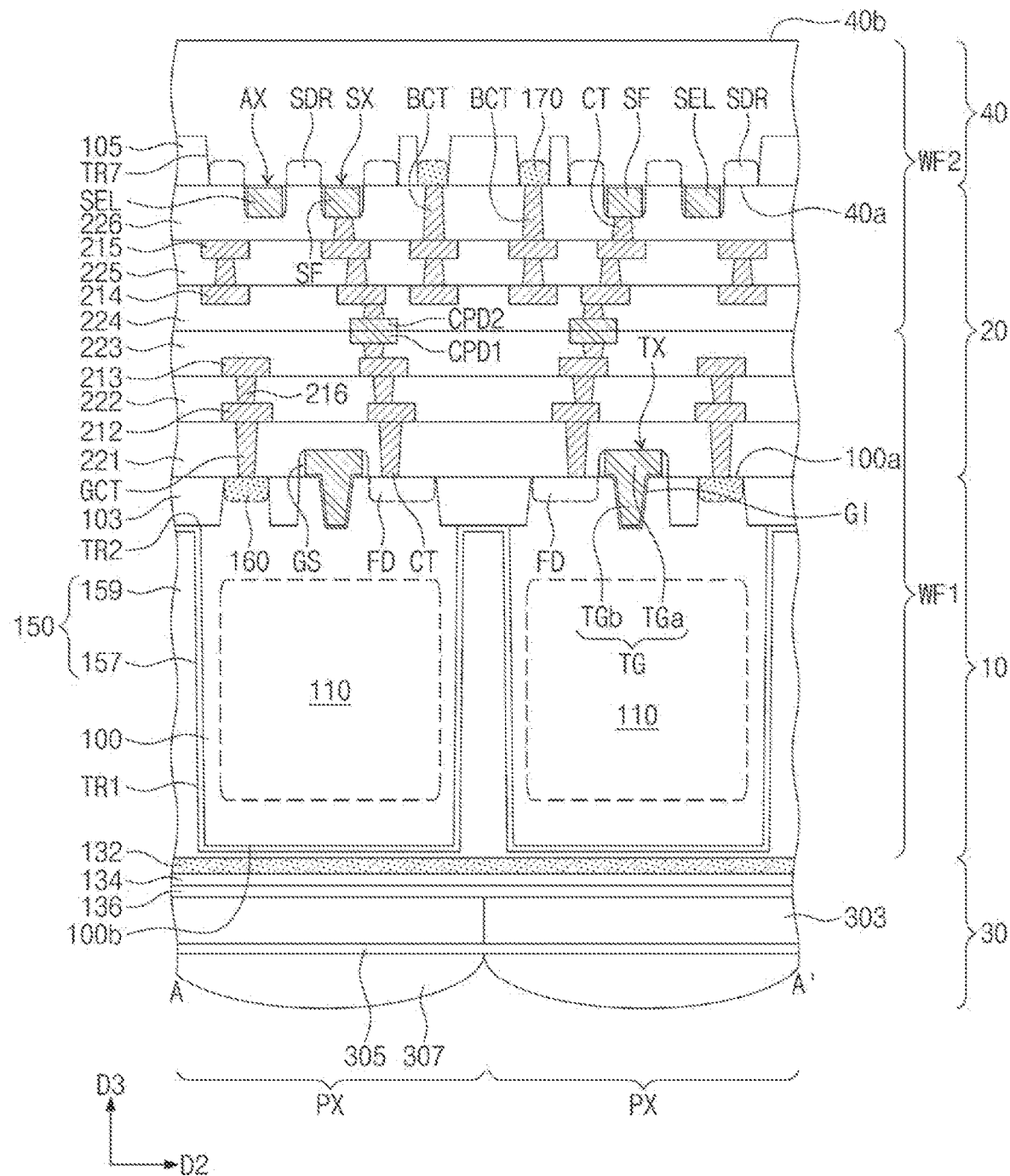

FIGS. 9A to 9C are sectional views, which are taken along the line A-A' of FIG. 4 to illustrate an image sensor according to an embodiment of the inventive concept. For concise description, a previously described element may be identified by the same reference number without repeating an overlapping description thereof.

Referring to FIG. 9A, the pixel isolation pattern 150 may be provided in the first trench TR1. The first trench TR1 may be an empty region that is recessed from the second surface 100b of the first substrate 100. The first trench TR1 may have a width that decreases in a direction from the second surface 100b of the first substrate 100 toward the first surface 100a.

The pixel isolation pattern 150 may include a fixed charge layer 157, which is conformally provided along an inner surface of the first trench TR1, and a gapfill insulating pattern 159, which is provided on the fixed charge layer 157. The fixed charge layer 157 may be configured to have negative fixed charges. The fixed charge layer 157 may be formed of metal oxide or metal fluoride containing at least one metal, which is selected from the group consisting of hafnium (Hf), zirconium (Zr), aluminum (Al), tantalum (Ta), titanium (Ti), yttrium (Y), and lanthanoid. For example, the fixed charge layer 157 may be a hafnium oxide layer or an aluminum oxide layer. In this case, hole accumulation may occur near the fixed charge layer 157. Thus, it may be possible to effectively prevent or suppress dark current and white spot issues from occurring. The gapfill insulating pattern 159 may be formed of or may include an insulating material having a good step coverage property. For example, the gapfill insulating pattern 159 may include a silicon oxide layer. The fixed charge layer 157 may be extended to a region on the second surface 100*b* of the first substrate 100. The gapfill insulating pattern 159 may also be extended to the region on the second surface 100*b* of the first substrate 100.

A doped region 120 may be interposed between the first surface 100*a* of the first substrate 100 and the pixel isolation pattern 150. The doped region 120 may be of the first conductivity type (e.g., p-type). The doped region 120 may be provided to enclose the top surface of the pixel isolation pattern 150.

Referring to FIG. 9B, the pixel isolation pattern 150 may be substantially the same as the pixel isolation pattern 150 of FIG. 9A, except that the first device isolation pattern 103 is provided between the first surface 100*a* of the first substrate 100 and the pixel isolation pattern 150. The first device isolation pattern 103 and the pixel isolation pattern 150 may be vertically spaced apart from each other. For example, a portion of the first substrate 100 may be extended into a region between the first device isolation pattern 103 and the pixel isolation pattern 150.

Referring to FIG. 9C, the pixel isolation pattern 150 may be substantially the same as the pixel isolation pattern 150 of FIG. 9A, except that the first device isolation pattern 103 is in contact with the pixel isolation pattern 150. For example, a bottom surface of the first device isolation pattern 103 may contact an upper surface of the fixed charge layer 157. The first device isolation pattern 103 may be interposed between the first surface 100*a* of the first substrate 100 and the pixel isolation pattern 150.

Figure 10:
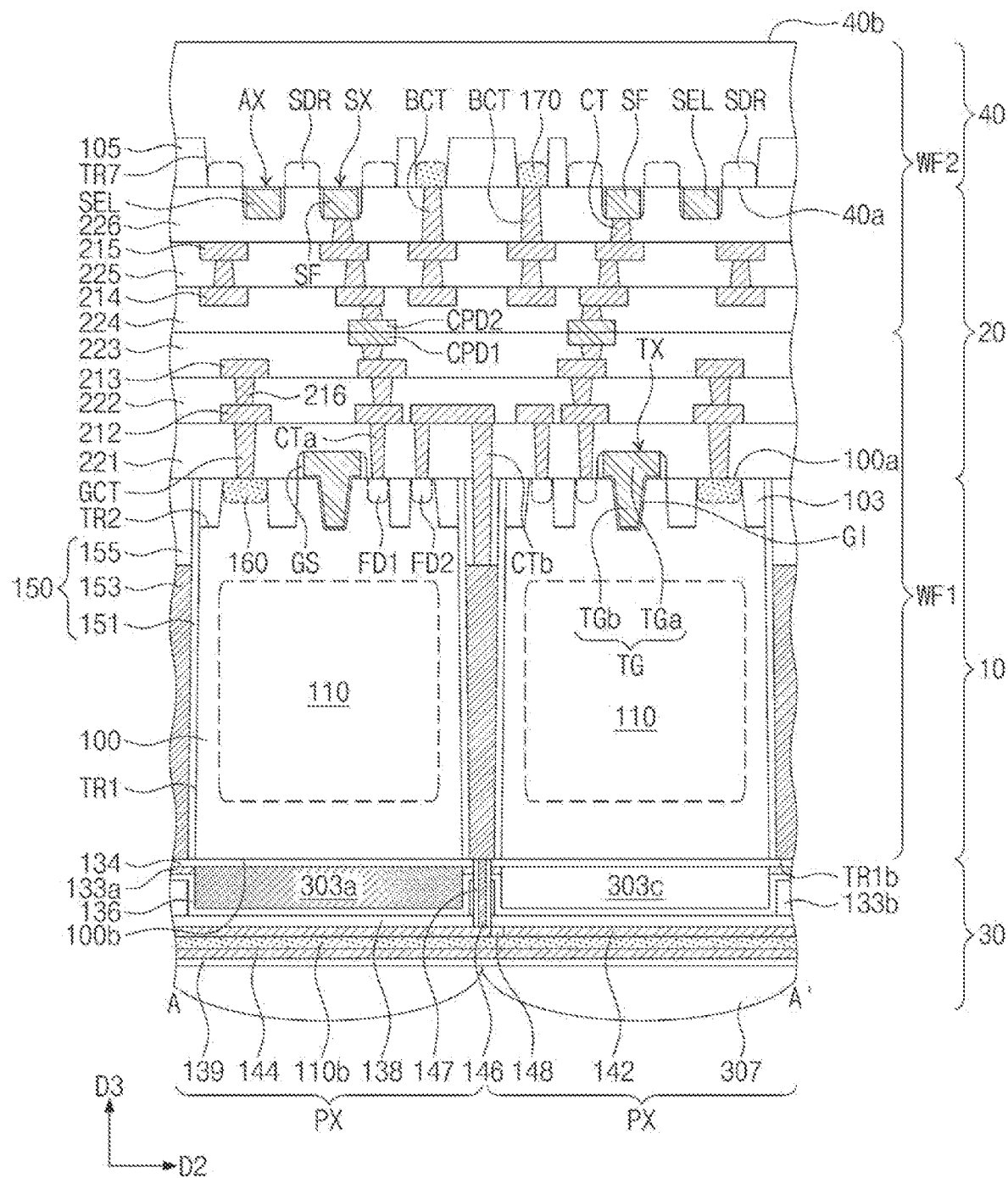
FIG. 10 is a sectional view illustrating an image sensor, according to an example embodiment of the inventive concept.

FIG. 10 is a sectional view illustrating an image sensor according to an embodiment of the inventive concept. For concise description, a previously described element may be identified by the same reference number without repeating an overlapping description thereof.

Referring to FIG. 10, the first photoelectric conversion layer 10 including the first substrate 100 may be provided. The transfer gate TG may be provided on the first surface 100*a* of the first substrate 100. The first device isolation pattern 103 may be provided in an upper portion of the first substrate 100. The first device isolation pattern 103 may be adjacent to the first surface 100*a* of the first substrate 100. A first floating diffusion region FD1 and a second floating diffusion region FD2 may be provided in an upper portion of the first substrate 100. The second floating diffusion region FD2 may be spaced apart from the first floating diffusion region FD1 by the first device isolation pattern 103.

The first insulating layer 134 may be provided on the second surface 100*b* of the first substrate 100. Color filters 303*a* and 303*c* may be disposed on the first insulating layer 134 and in the unit pixel regions PX, respectively. A light-blocking pattern 133*a* may be disposed on the first insulating layer 134 and between the color filters 303*a* and 303*c*. Side and bottom surfaces of the color filters 303*a* and 303*c* and a bottom surface of the light-blocking pattern 133*a* may be covered with the second insulating layer 136. A space between the color filters 303*a* and 303*c* may be filled with a low-refractive pattern 133*b*.

A third insulating layer 138 may be provided on the second insulating layer 136 and the low-refractive pattern 133*b*. A pixel electrode 142 may be provided on the third insulating layer 138 and in each of the unit pixel regions PX. An insulating pattern 148 may be interposed between the pixel electrodes 142. The insulating pattern 148 may include, for example, a silicon oxide layer or a silicon nitride layer. A second photoelectric conversion layer 110*b* may be provided on the pixel electrodes 142. A common electrode 144 may be provided on the second photoelectric conversion layer 110*b*. A passivation layer 139 may be provided on the common electrode 144. The micro lenses 307 may be provided on the passivation layer 139.

The pixel electrode 142 and the common electrode 144 may be formed of or may include at least one of indium tin oxide (ITO), indium zinc oxide (IZO), zinc oxide (ZnO), and/or organic transparent conductive materials. The second photoelectric conversion layer 110*b* may be, for example, an organic photoelectric conversion layer. The second photoelectric conversion layer 110*b* may be formed of or may include a p-type organic semiconductor material and an n-type organic semiconductor material, and here, the p-type and n-type organic semiconductor materials may form a p-n junction. Alternatively, the second photoelectric conversion layer 110*b* may include quantum dots or a chalcogenide material.

The pixel electrode 142 may be electrically connected to the pixel isolation pattern 150 through a via plug 146. More specifically, the pixel electrode 142 may be electrically connected to the second isolation pattern 153 of the pixel isolation pattern 150. The via plug 146 may be provided to penetrate the third insulating layer 138, the low-refractive pattern 133*b*, the second insulating layer 136, the light-blocking pattern 133*a*, and the first insulating layer 134 and may be in contact with the pixel isolation pattern 150. A side surface of the via plug 146 may be covered with a via insulating layer 147. The pixel isolation pattern 150 may be electrically connected to the second floating diffusion region FD2 through the first interconnection line 212 and contacts CTa and CTb. Each of the first contacts CTa may be coupled to at least one of the first impurity region 160, the transfer gate TG, and the first and second floating diffusion regions FD1 and FD2. The second contact CTb may be coupled to the second isolation pattern 153. For example, a bottom surface of the second contact CTb may contact an upper surface of the second isolation pattern 153. A bottom surface of the second contact CTb may be located at a level lower than bottom surfaces of the first contacts CTa.

Figure 11:
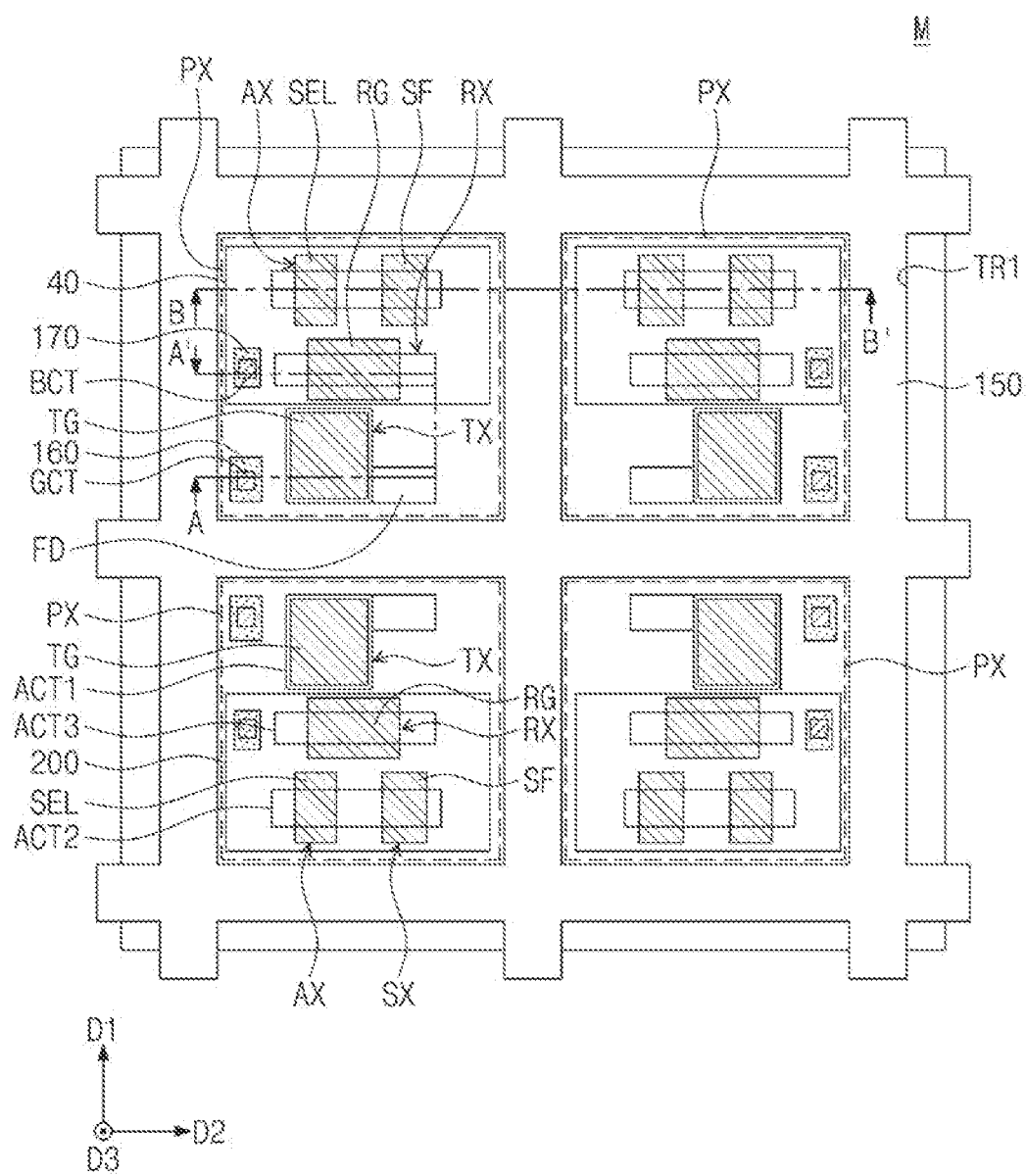
FIG. 11 is an enlarged plan view illustrating a portion (e.g., 'M' of FIG. 2) of an image sensor, according to an example embodiment of the inventive concept.
Figure 12A:
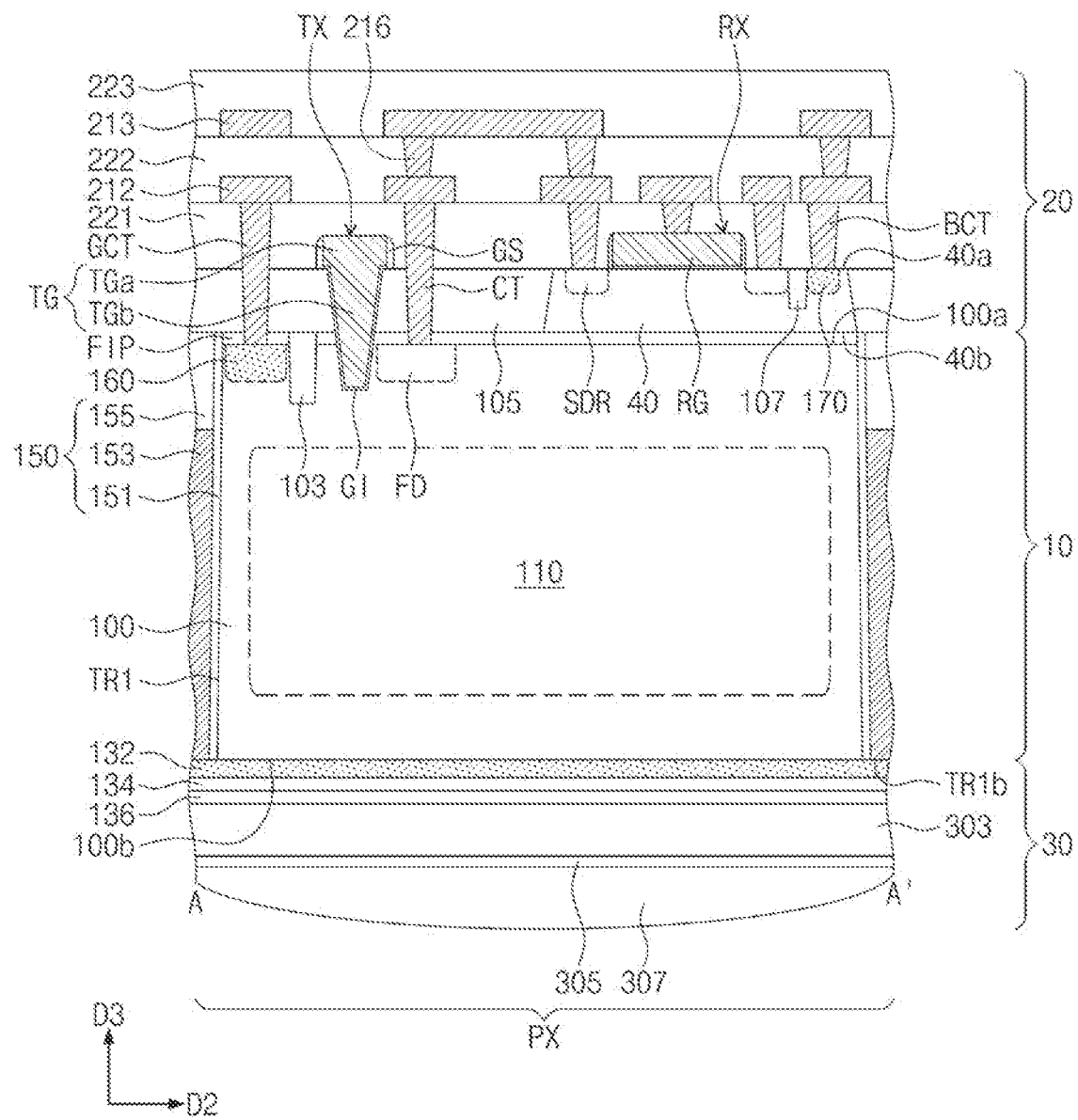
FIGS. 12A and 12B are sectional views taken along lines A-A' and B-B' of FIG. 11, respectively.
Figure 12B:
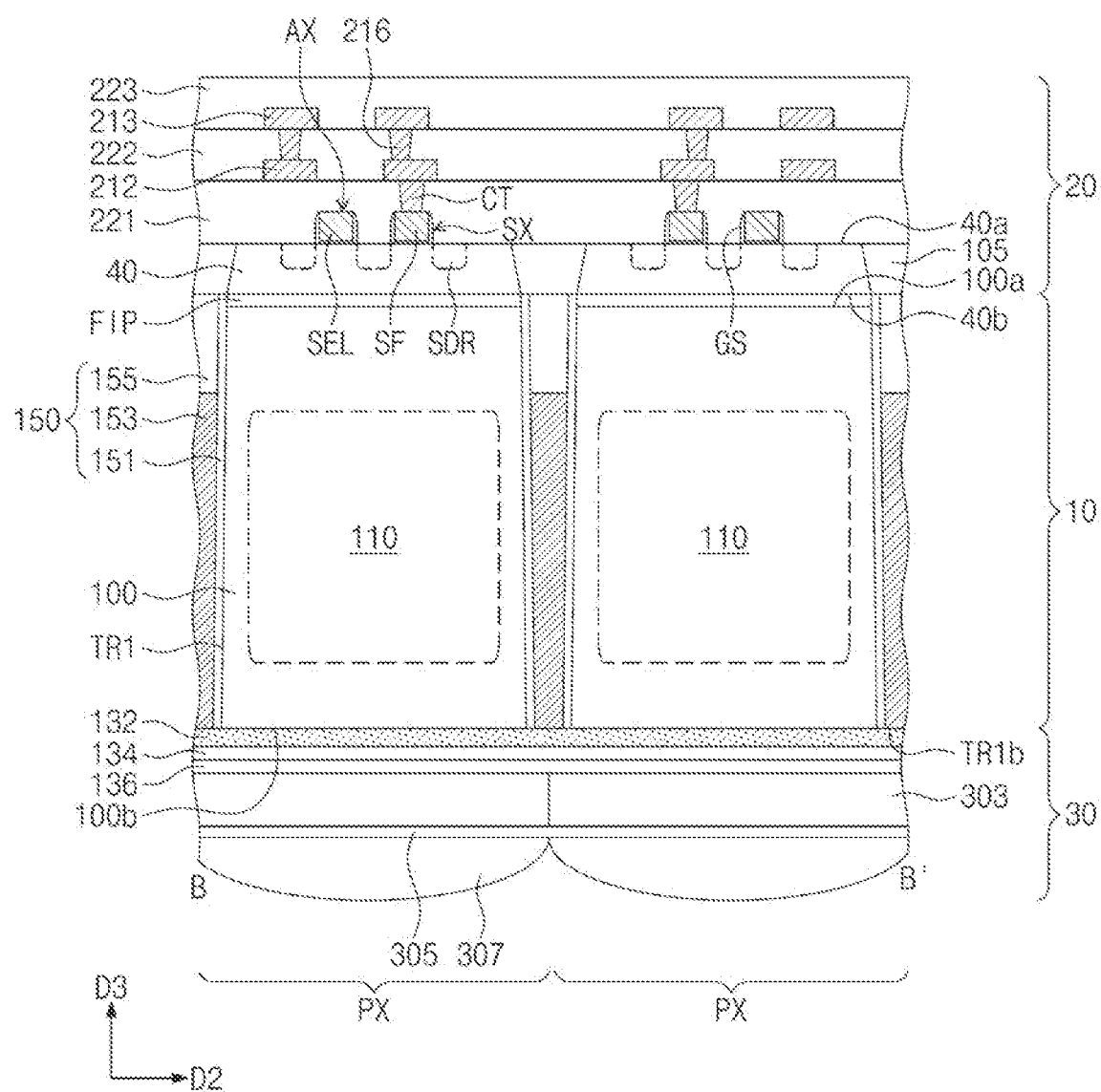

FIG. 11 is an enlarged plan view illustrating a portion (e.g., 'M' of FIG. 2) of an image sensor according to an embodiment of the inventive concept. FIGS. 12A and 12B are sectional views taken along lines A-A' and B-B' of FIG. 11, respectively. In the following description, an element previously described above may be identified by the same reference number without repeating an overlapping description thereof.

Referring to FIGS. 11, 12A, and 12B, a buried insulating layer FIP may be provided on the first substrate 100. The buried insulating layer FIP may include, for example, a silicon oxide layer. The second substrate 40 may be provided on the buried insulating layer FIP. The second substrate 40 may be provided on each of the unit pixel regions PX. The second substrate 40 may be locally provided on a portion of the first substrate 100.

The second substrate 40 may include the third surface 40*a* and the fourth surface 40*b*, which are opposite to each other. The fourth surface 40*b* of the second substrate 40 may face the first surface 100*a* of the first substrate 100. The second substrate 40 may be a semiconductor substrate. The semiconductor substrate may include, for example, a silicon substrate, a germanium substrate, or a silicon-germanium substrate. The first substrate 100, the buried insulating layer FIP, and the second substrate 40 may constitute a silicon-on-insulator (SOI) substrate.

The pixel isolation pattern 150 may be provided to penetrate the buried insulating layer FIP and the first substrate 100. The first device isolation pattern 103 may be provided to penetrate the buried insulating layer FIP and may be partially inserted into an upper portion of the first substrate 100. The second device isolation pattern 105 may be provided on the buried insulating layer FIP. The second device isolation pattern 105 may cover the buried insulating layer FIP and the pixel isolation pattern 150. The second device isolation pattern 105 may be in contact with a side surface of the second substrate 40. A top surface of the second device isolation pattern 105 may be substantially coplanar with a top surface of the second substrate 40.

The transfer transistor TX may be provided on the first surface 100a of the first substrate 100. The transfer gate TG of the transfer transistor TX may be provided to penetrate the second device isolation pattern 105 and the buried insulating layer FIP and may be partially inserted into an upper portion of the first substrate 100. The transfer gate TG may include the upper portion TGa, which protrudes above the top surface of the second device isolation pattern 105, and the lower portion TGb, which is provided in the second device isolation pattern 105, the buried insulating layer FIP, and the first substrate 100.

The floating diffusion region FD and the first impurity region 160 may be provided in an upper portion of the first substrate 100. The floating diffusion region FD and the first impurity region 160 may be provided below the buried insulating layer FIP.

The selection transistor AX, the source follower transistor SX, and the reset transistor RX may be provided on the third surface 40a of the second substrate 40. The selection transistor AX, the source follower transistor SX, and the reset transistor RX may include the selection gate SEL, the source follower gate SF, and the reset gate RG, respectively. Each of the selection transistor AX, the source follower transistor SX, and the reset transistor RX may include the source/drain region SDR. The source/drain region SDR may be provided adjacent to the third surface 40a of the second substrate 40. The second impurity region 170 may be provided adjacent to the third surface 40a of the second substrate 40. The source/drain region SDR and the second impurity region 170 may be substantially the same as the source/drain region SDR and the second impurity region 170 described with reference to FIGS. 4, 5, 6, 7A, and 7B.

A third device isolation pattern 107 may be provided adjacent to the third surface 40a of the second substrate 40. The source/drain region SDR and the second impurity region 170 may be spaced apart from each other by the third device isolation pattern 107. In an embodiment, the third device isolation pattern 107 between the source/drain region SDR and the second impurity region 170 may be omitted.

The first insulating layer 221, the second insulating layer 222, and the third insulating layer 223 may be sequentially stacked on the second device isolation pattern 105 and the second substrate 40. The first interconnection lines 212 may be provided in the second insulating layer 222. The second interconnection lines 213 may be provided in the third insulating layer 223. The vias 216 may be provided in the insulating layers 221, 222, and 223. The vias 216 may be used to connect the first and second interconnection lines 212 and 213 to each other.

The contacts CT may be provided in the first insulating layer 221. Each of the contacts CT may be provided to penetrate the first insulating layer 221 and may be electrically connected to at least one of the floating diffusion region FD, the source/drain region SDR, or the gate electrodes TG, RG, SEL, and SF. The contact CT, which is electrically connected to the floating diffusion region FD, may be provided to penetrate the first insulating layer 221, the second device isolation pattern 105, and the buried insulating layer FIP.

The ground contact GCT coupled to the first impurity region 160 may be provided. The ground contact GCT may be provided to penetrate the first insulating layer 221, the second device isolation pattern 105, and the buried insulating layer FIP. The ground contact GCT may be used to apply a ground voltage to the first substrate 100.

The body contact BCT coupled to the second impurity region 170 may be provided. The body contact BCT may be provided to penetrate the first insulating layer 221. The body contact BCT may be used to apply a negative voltage to the second substrate 40. The voltage applied through the body contact BCT may correspond to the body voltage $V_{BO}$ described with reference to FIG. 1. The ground contact GCT and the body contact BCT may be electrically separated from each other. Thus, the voltage applied to the first substrate 100 through the ground contact GCT may be different from the voltage applied to the second substrate 40 through the body contact BCT.

According to an embodiment of the inventive concept, the ground contact GCT coupled to the first impurity region 160 of the first substrate 100 may be electrically separated from the body contact BCT coupled to the second impurity region 170 of the second substrate 40. Accordingly, it may be possible to apply two different voltages to the first and second substrates 100 and 40, respectively. This may make it possible to increase operation voltage ranges of transistors, which are provided on the first and second substrates 100 and 40, and to increase a degree of freedom in operating the image sensor. In addition, since a negative voltage is applied to the second substrate 40, a hole accumulation phenomenon may occur in a region between the buried insulating layer FIP and the first substrate 100. In this case, it may be possible to prevent a dark current from being produced. As a result, the electric characteristics of the image sensor may be improved.

Figure 13:
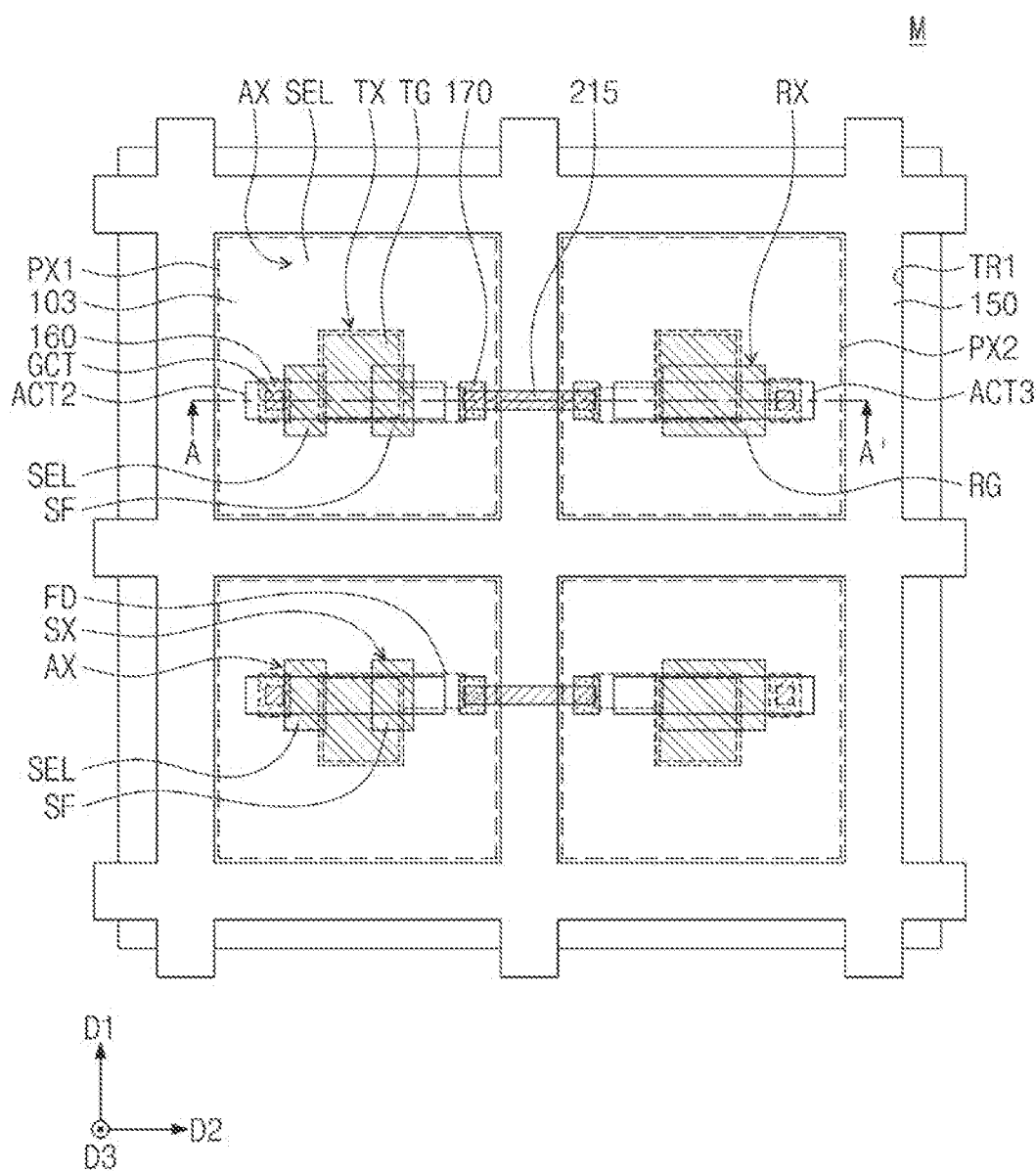
FIG. 13 is an enlarged plan view illustrating a portion (e.g., 'M' of FIG. 2) of an image sensor, according to an example embodiment of the inventive concept.
Figure 14:
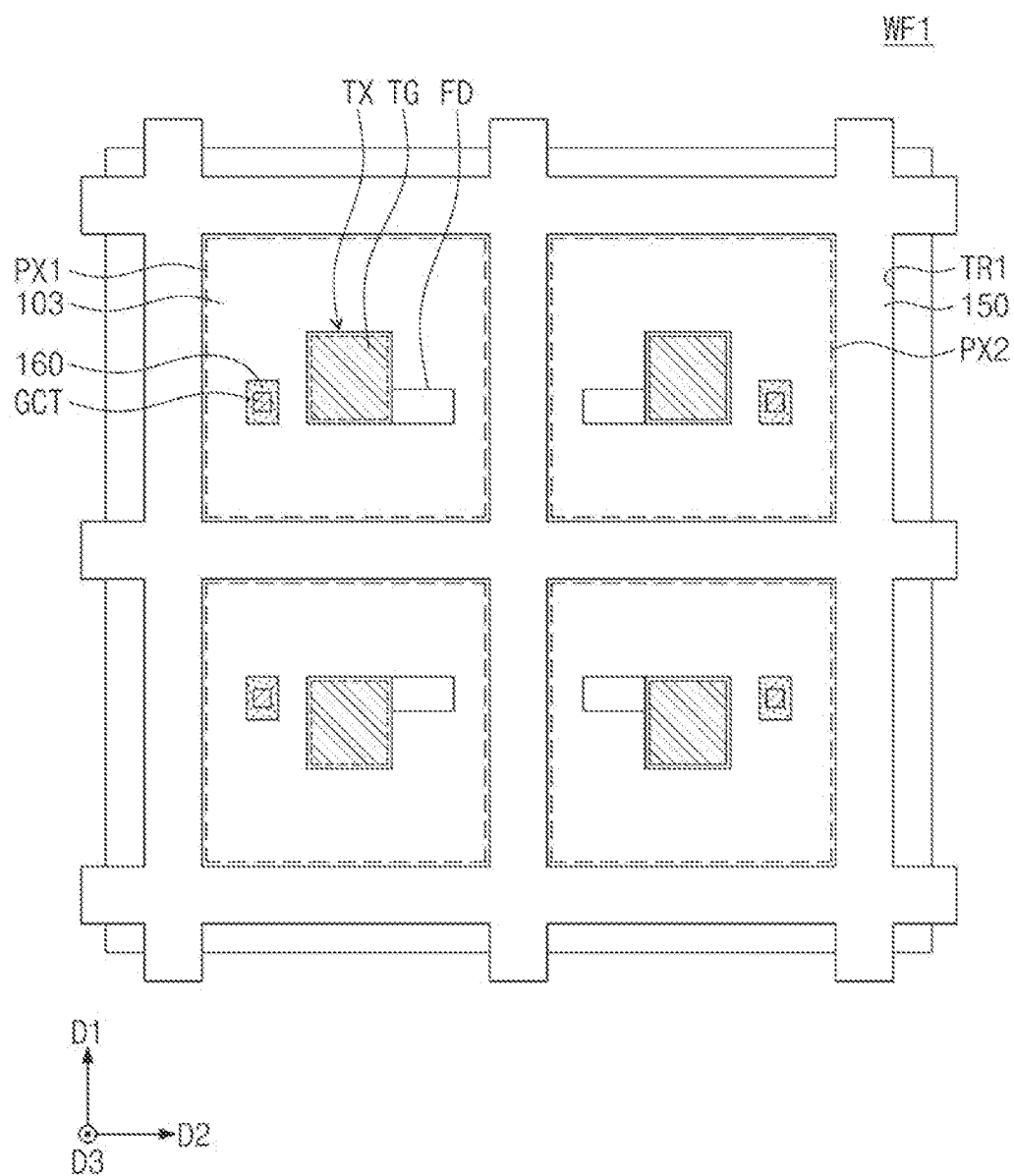
FIG. 14 is a plan view of a first wafer portion of the image sensor of FIG. 13.
Figure 15:
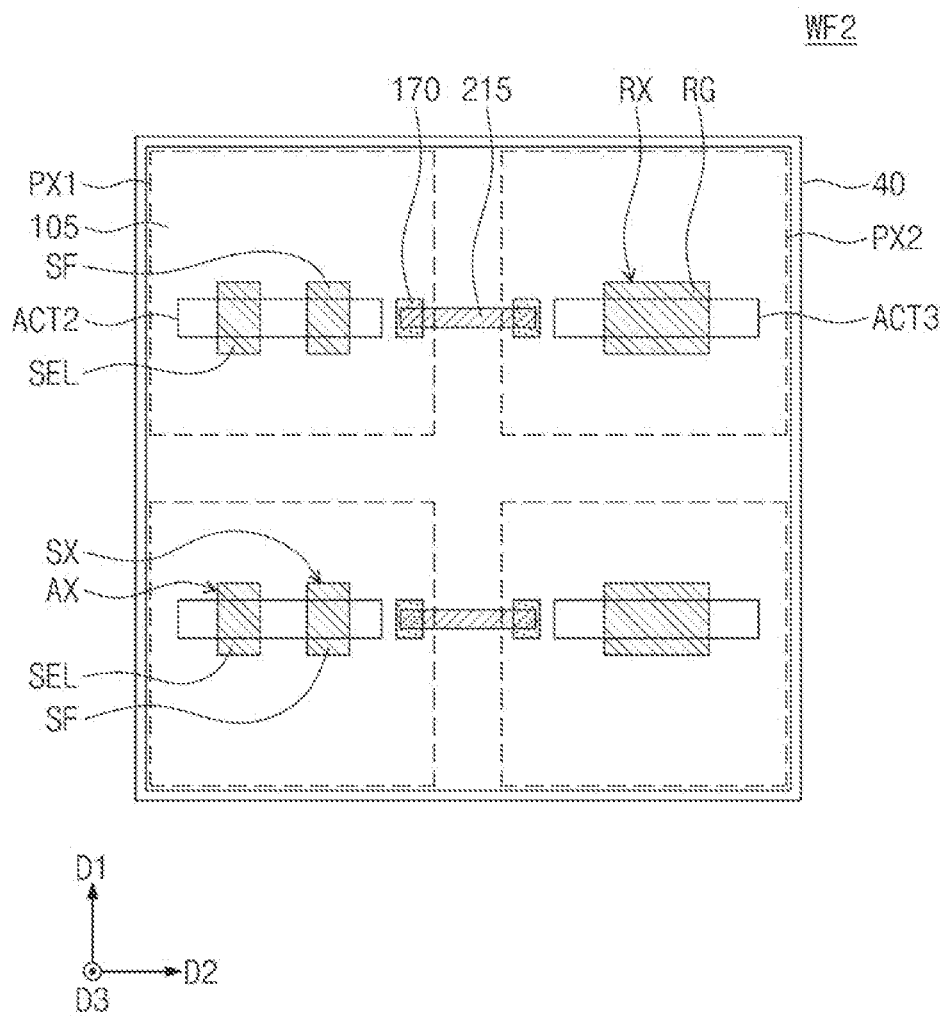
FIG. 15 is a plan view of a second wafer portion of the image sensor of FIG. 13.
Figure 16:
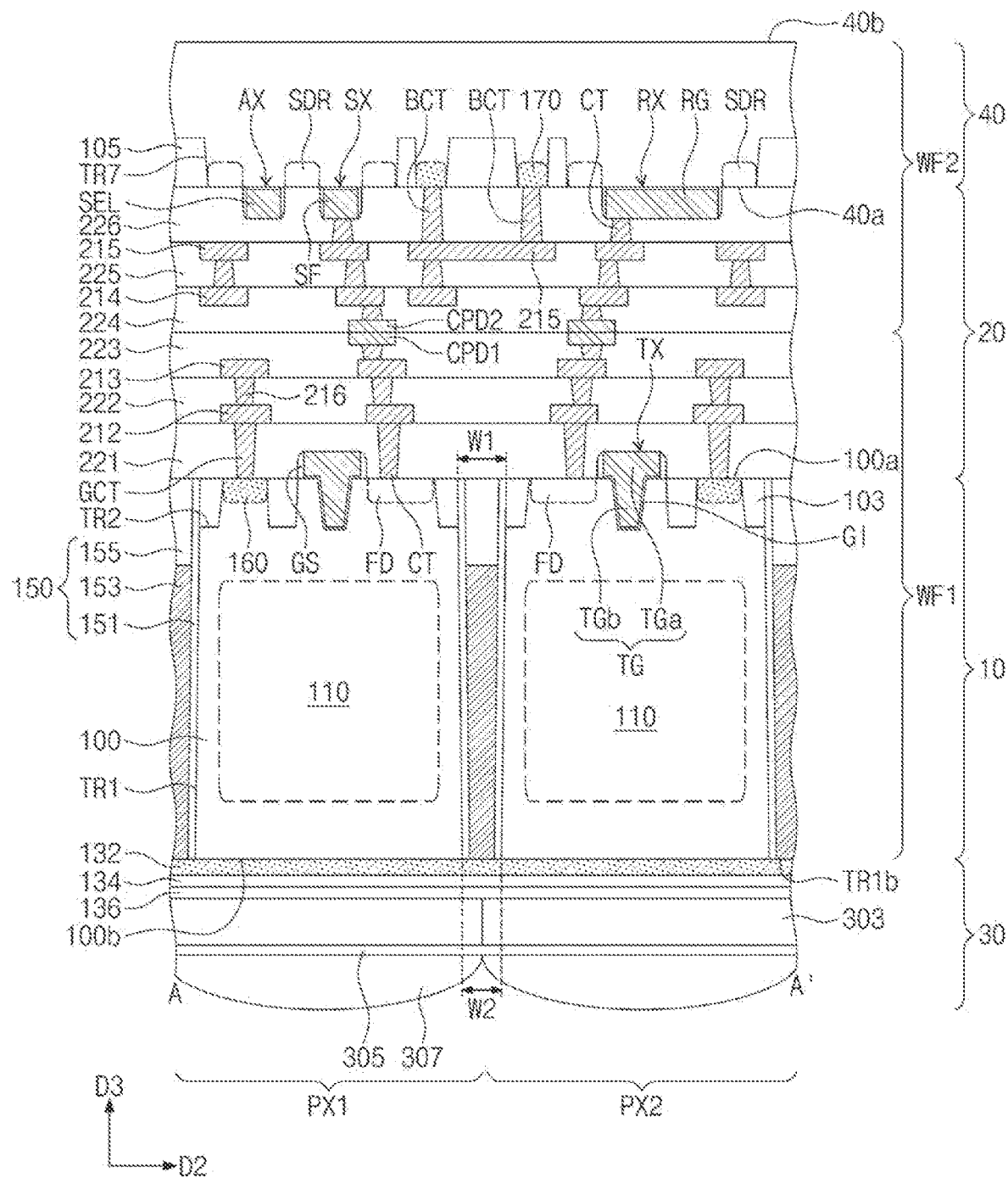
FIG. 16 is a sectional view taken along a line A-A' of FIG. 13.

FIG. 13 is an enlarged plan view illustrating a portion (e.g., 'M' of FIG. 2) of an image sensor according to an embodiment of the inventive concept. FIG. 14 is a plan view of a first wafer portion of the image sensor of FIG. 13. FIG. 15 is a plan view of a second wafer portion of the image sensor of FIG. 13. FIG. 16 is a sectional view taken along a line A-A' of FIG. 13. For concise description, a previously described element may be identified by the same reference number without repeating an overlapping description thereof.

Referring to FIGS. 13 to 16, the unit pixel regions PX may include a first pixel region PX1 and a second pixel region PX2. The second active pattern ACT2 may be provided in the second substrate 40, which is vertically overlapped with the first pixel region PX1. The selection transistor AX and the source follower transistor SX may be provided on the second active pattern ACT2. The third active pattern ACT3 may be provided in the second substrate 40, which is vertically overlapped with the second pixel region PX2. The reset transistor RX may be provided on the third active pattern ACT3. The selection transistor AX, the source follower transistor SX, and the reset transistor RX may be provided on the third surface 40a of the second substrate 40.

One second impurity region 170 may be provided in the second substrate 40, which is vertically overlapped with the first pixel region PX1. One second impurity region 170 may be provided in the second substrate 40, which is vertically overlapped with the second pixel region PX2. The second impurity region 170 on the first pixel region PX1 and the second impurity region 170 on the second pixel region PX2 may be electrically connected to each other. For example, the second impurity region 170 on the first pixel region PX1 and the second impurity region 170 on the second pixel region PX2 may be electrically connected to each other through the fourth interconnection line 215 connecting the body contacts BCT.

According to the inventive concept, a ground contact, which is coupled to a first impurity region of a first substrate, may be electrically disconnected from a body contact, which is coupled to a second impurity region of a second substrate. Accordingly, it may be possible to independently apply different voltages to the first and second substrates and thereby to increase an operation voltage range of transistors and to increase a degree of freedom in operating the image sensor.

While example embodiments of the inventive concept have been particularly shown and described, it will be understood by one of ordinary skill in the art that variations in form and detail may be made therein without departing from the spirit and scope of the attached claims.

What is claimed is:

1. An image sensor, comprising:
a first substrate having a first surface and a second surface, which are opposite to each other, the first substrate comprising unit pixel regions, each of which includes a device isolation pattern and a photoelectric conversion region that are provided adjacent to the first surface of the first substrate;
a pixel isolation pattern provided in the first substrate to define the unit pixel regions, the pixel isolation pattern penetrating the device isolation pattern;
a first impurity region and a floating diffusion region, which are provided in the first substrate and adjacent to the first surface, each of the first impurity region and the floating diffusion region being adjacent to a portion of the device isolation pattern;
a second substrate provided on the first substrate, the second substrate having a third surface and a fourth surface, which are opposite to each other;
a second impurity region provided in the second substrate and adjacent to the third surface;
a ground contact coupled to the first impurity region; and
a body contact coupled to the second impurity region,
wherein the ground contact and the body contact are electrically separated from each other.

2. The image sensor of claim 1, wherein the third surface of the second substrate faces the first surface of the first substrate.

3. The image sensor of claim 2, further comprising:
a first gate electrode provided on the first surface of the first substrate to penetrate a portion of the first substrate; and
a second gate electrode provided on the third surface of the second substrate,
wherein the second gate electrode is electrically connected to the floating diffusion region.

4. The image sensor of claim 3, further comprising:
a third gate electrode spaced apart from the second gate electrode in a first direction; and
a fourth gate electrode spaced apart from the second gate electrode in a second direction crossing the first direction, when viewed in a plan view,
wherein the third and fourth gate electrodes are provided on the third surface of the second substrate.

5. The image sensor of claim 3, further comprising:
a first insulating layer covering the first surface of the first substrate;
a first conductive pad on the first insulating layer;
a second insulating layer covering the third surface of the second substrate; and
a second conductive pad disposed below the second insulating layer to be in contact with the first conductive pad,
wherein the first conductive pad is electrically connected to the floating diffusion region, and
wherein the second conductive pad is electrically connected to the second gate electrode.

6. The image sensor of claim 1, wherein the body contact is used to apply a negative voltage to the second substrate.

7. The image sensor of claim 1, further comprising:
a buried insulating layer interposed between the first substrate and the second substrate,
wherein the fourth surface of the second substrate faces the first surface of the first substrate.

8. The image sensor of claim 7, wherein the ground contact is provided to penetrate the buried insulating layer.

9. The image sensor of claim 1,
wherein the unit pixel regions comprise a first pixel region and a second pixel region, which are adjacent to each other,
wherein the second impurity region comprises a plurality of second impurity regions, and
wherein the second impurity regions are provided on the first pixel region and the second pixel region, respectively, and are electrically connected to each other.

10. The image sensor of claim 1, wherein the pixel isolation pattern comprises:
a first isolation pattern spaced apart from the first substrate; and
a second isolation pattern interposed between the first isolation pattern and the first substrate.

11. An image sensor, comprising:
a first substrate having a first surface and a second surface, which are opposite to each other, and comprising a plurality of unit pixel regions, each of the plurality of unit pixel regions including a device isolation pattern and a floating diffusion region, which are provided adjacent to the first surface, and a photoelectric conversion region, which is provided below the floating diffusion region;
a second substrate on the first substrate, the second substrate comprising a third surface and a fourth surface, which are opposite to each other;
an insulating layer provided between the first substrate and the second substrate;
a pixel isolation pattern provided to penetrate the first substrate and the device isolation pattern and to define the plurality of unit pixel regions;
a first impurity region provided in the first substrate and adjacent to a portion of the device isolation pattern;
a second impurity region adjacent to the third surface of the second substrate;
a ground contact coupled to the first impurity region; and
a body contact coupled to the second impurity region, wherein a voltage applied to the first substrate through the ground contact is different from a voltage applied to the second substrate through the body contact.

12. The image sensor of claim 11, further comprising:
a first gate electrode provided on the first surface of the first substrate to penetrate a portion of the first substrate; and
a second gate electrode provided on the third surface of the second substrate,
wherein the third surface of the second substrate faces the first surface of the first substrate.

13. The image sensor of claim 12,
wherein the insulating layer comprises a first insulating layer covering the first surface of the first substrate and a second insulating layer covering the third surface of the second substrate, and
wherein the image sensor further comprises:
a first conductive pad on the first insulating layer; and
a second conductive pad provided below the second insulating layer to be in contact with the first conductive pad,
wherein the first conductive pad is electrically connected to the floating diffusion region, and
wherein the second conductive pad is electrically connected to the second gate electrode.

14. The image sensor of claim 11,
wherein the ground contact is provided to penetrate the insulating layer, and
wherein the fourth surface of the second substrate faces the first surface of the first substrate.

15. The image sensor of claim 11, wherein the body contact is used to apply a negative voltage to the second substrate.

16. An image sensor, comprising:
a first substrate having a first surface and a second surface, which are opposite to each other, and comprising an optical black region, a pad region, and a pixel array region including a plurality of unit pixel regions;
a pixel isolation pattern provided in the first substrate to define the plurality of unit pixel regions, the pixel isolation pattern comprising a first isolation pattern and a second isolation pattern interposed between the first isolation pattern and the first substrate;
a photoelectric conversion region provided in each of the plurality of unit pixel regions;
a device isolation pattern, a first impurity region, and a floating diffusion region, which are provided in each of the plurality of unit pixel regions and are adjacent to the first surface, each of the first impurity region and the floating diffusion region being adjacent to a portion of the device isolation pattern;
a first gate electrode on the first surface of the first substrate;
a gate dielectric pattern interposed between the first gate electrode and the first substrate;
a gate spacer provided on a side surface of the first gate electrode;
a second substrate provided on the first substrate, the second substrate having a third surface and a fourth surface, which are opposite to each other;
a second impurity region provided adjacent to the third surface of the second substrate;
an interlayer insulating layer provided between the first substrate and the second substrate;
a ground contact provided in the interlayer insulating layer and coupled to the first impurity region;
a body contact provided in the interlayer insulating layer and coupled to the second impurity region;
an anti-reflection layer provided on the second surface of the first substrate;
a rear insulating layer on a bottom surface of the anti-reflection layer;
a color filter on a bottom surface of the rear insulating layer; and
a micro lens on a bottom surface of the color filter,
wherein the ground contact and the body contact are electrically separated from each other.

17. The image sensor of claim 16, wherein a voltage applied to the first substrate through the ground contact is different from a voltage applied to the second substrate through the body contact.

18. The image sensor of claim 16, further comprising:
a second gate electrode provided on the third surface of the second substrate,
wherein the second gate electrode is electrically connected to the floating diffusion region, and
wherein the third surface faces the first surface.

19. The image sensor of claim 18,
wherein the interlayer insulating layer comprises a first interlayer insulating layer covering the first surface of the first substrate and a second interlayer insulating layer covering the third surface of the second substrate, and
wherein the image sensor further comprises:
a first conductive pad on the first interlayer insulating layer; and
a second conductive pad disposed below the second interlayer insulating layer to be in contact with the first conductive pad,
the first conductive pad is electrically connected to the floating diffusion region, and
the second conductive pad is electrically connected to the second gate electrode.

20. The image sensor of claim 18, further comprising:
a third gate electrode spaced apart from the second gate electrode in a first direction; and
a fourth gate electrode spaced apart from the second gate electrode in a second direction crossing the first direction, when viewed in a plan view,
wherein the third and fourth gate electrodes are provided on the third surface of the second substrate.

* * * * *